United States Patent
Sunaga et al.

(10) Patent No.: US 11,541,389 B2
(45) Date of Patent: Jan. 3, 2023

(54) FLUID HANDLING DEVICE AND FLUID HANDLING SYSTEM

(71) Applicant: Enplas Corporation, Saitama (JP)

(72) Inventors: Nobuya Sunaga, Saitama (JP); Takumi Yamauchi, Saitama (JP); Satomi Yabuuchi, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 160 days.

(21) Appl. No.: 17/041,463

(22) PCT Filed: Mar. 25, 2019

(86) PCT No.: PCT/JP2019/012311
§ 371 (c)(1),
(2) Date: Sep. 25, 2020

(87) PCT Pub. No.: WO2019/188872
PCT Pub. Date: Oct. 3, 2019

(65) Prior Publication Data
US 2021/0031194 A1 Feb. 4, 2021

(30) Foreign Application Priority Data

Mar. 27, 2018 (JP) .............................. JP2018-060326

(51) Int. Cl.
*B01L 3/00* (2006.01)
*B81B 1/00* (2006.01)
*F16K 99/00* (2006.01)

(52) U.S. Cl.
CPC ........ *B01L 3/502715* (2013.01); *B81B 1/006* (2013.01); *F16K 99/0015* (2013.01);
(Continued)

(58) Field of Classification Search
CPC .. B01L 3/502715; B01L 3/5027; B01L 3/502; B01L 3/50; B01L 2200/0621; B01L 2300/0867; B01L 2400/0644; B81B 1/006; B81B 2201/054; B81B 2203/0338; F16K 99/0015; F16K 99/0034
(Continued)

(56) References Cited

U.S. PATENT DOCUMENTS

2014/0356849 A1* 12/2014 Wikswo ................ B01L 3/5027
435/284.1

FOREIGN PATENT DOCUMENTS

JP 2007085537 A 4/2007
WO 2018030253 A1 2/2018

OTHER PUBLICATIONS

International Search Report from International Application No. PCT/JP2019/012311, dated Jun. 25, 2019.

* cited by examiner

*Primary Examiner* — Christine T Mui
(74) *Attorney, Agent, or Firm* — Brundidge & Stanger, P.C.

(57) ABSTRACT

This fluid handling device has a rotary member that is rotatable around the central axis. In the rotary member, a first protruding part for pressing and closing a valve of a flow channel chip and a recessed part for opening the valve without pressing the valve are disposed on the circumference of a first circle around the central axis. The rotary member further has a second protruding part for, when the recessed part is located at the valve in a state where the rotary member is rotated, pressing the valve so as not to open the valve.

6 Claims, 21 Drawing Sheets

(52) U.S. Cl.
CPC ... *F16K 99/0034* (2013.01); *B01L 2200/0621* (2013.01); *B01L 2300/0867* (2013.01); *B01L 2400/0644* (2013.01); *B81B 2201/054* (2013.01); *B81B 2203/0338* (2013.01)

(58) Field of Classification Search
USPC .......................................... 422/502, 500, 50
See application file for complete search history.

FLUID HANDLING DEVICE AND FLUID HANDLING SYSTEM

TECHNICAL FIELD

The present invention relates to a fluid handling device configured to control fluid in a channel of a channel chip including a plurality of valves, and a fluid handling system including the channel chip and the fluid handling device.

BACKGROUND ART

In recent years, a channel chip is used to analyze trace amounts of substances such as proteins and nucleic acids with high precision and speed. Advantageously, a channel chip requires only a small amount of sample or reagent required for an analysis, and is expected to be used for various uses such as laboratory tests, food tests, and environment tests. For example, PTL 1 discloses a micro valve unit that includes a channel chip including a plurality of micro valves, and a pressing part for controlling the opening and closing of the micro valves. In the channel chip, the micro valves are disposed on the same circumference. In addition, the pressing part includes a contact surface having an arc-like shape in plan view. When the pressing part is rotated, the contact surface of the pressing part moves. In this manner, the diaphragm of the micro valve is pressed, or not pressed by the pressing part. The micro valve is closed when pressed by the pressing part, and the micro valve is open when not pressed by the pressing part.

CITATION LIST

Patent Literature

PTL 1
Japanese Patent Application Laid-Open No. 2007-85537

SUMMARY OF INVENTION

Technical Problem

As described above, in the device (micro valve unit) disclosed in PTL 1, a rotary member (pressing part) including a protrusion (end surface) having an arc-like shape in plan view is rotated to control the opening and closing of the valves (micro valves). When the channel chip includes a plurality of valves in such a device, the valves may not be opened and closed in the intended order. This problem is described below with reference to FIGS. 1A to 2B.

FIG. 1A is a plan view of a channel chip for describing a problem of a known technique. FIG. 1B is a bottom view of a rotary member combined with the channel chip illustrated in FIG. 1A. As illustrated in FIG. 1A, the channel chip includes first inlet 10, first introduction channel 11, first valve 12, second inlet 20, second introduction channel 21, second valve 22, third inlet 30, third introduction channel 31, third valve 32, common channel 40 and outlet 41. The upstream end of first introduction channel 11 is connected to first inlet 10, and the downstream end of first introduction channel 11 is connected to the upstream end of common channel 40. The upstream end of second introduction channel 21 is connected to second inlet 20, and the downstream end of second introduction channel 21 is connected to the upstream end of common channel 40. The upstream end of third introduction channel 31 is connected to third inlet 30, and the downstream end of third introduction channel 31 is connected to the upstream end of common channel 40. First introduction channel 11, second introduction channel 21 and third introduction channel 31 are provided with first valve 12, second valve 22 and third valve 32, respectively. The downstream end of common channel 40 is connected to outlet 41.

In addition, as illustrated in FIG. 1B, the rotary member includes protrusion 50 having an arc-like shape in plan view for pressing first valve 12, second valve 22 and third valve 32, and recess 51 disposed on the circumference same as that of the protrusion 50. In FIG. 1B, the bottom surface (the surface that makes contact with the channel chip) of protrusion 50 is hatched. First valve 12, second valve 22 and third valve 32 are closed when pressed by protrusion 50, but are open when not pressed by protrusion 50.

For example, as illustrated in FIG. 2A, the rotary member is rotated such that recess 51 is located over first valve 12 and that protrusion 50 is located over second valve 22 and third valve 32. In this case, first valve 12 is open, and the fluid in first inlet 10 can flow to outlet 41 through first introduction channel 11 and common channel 40. On the other hand, second valve 22 and third valve 32 are closed, and therefore the liquid in second inlet 20 and the fluid in third inlet 30 cannot flow toward outlet 41.

Thereafter, when it is desired to cause the fluid in third inlet 30 to flow toward outlet 41, the rotary member is rotated such that recess 51 is located over third valve 32 and that protrusion 50 is located over first valve 12 and second valve 22. However, as illustrated in FIG. 2B, while the rotary member is rotated, recess 51 is temporarily located over second valve 22 and protrusion 50 is temporarily located over first valve 12 and third valve 32. As a result, the fluid in second inlet 20 that is not intended to deliver may flow toward outlet 41.

As described above, in the known device, when the channel chip includes a plurality of valves, the valves may not be opened and closed in the intended order.

An object of the present invention is to provide a fluid handling device that can open and close a valve in an intended order by using a rotary member even when a channel chip includes a plurality of valves. In addition, another object of the present invention is to provide a fluid handling system including the channel chip and the fluid handling device.

Solution to Problem

A fluid handling device of an embodiment of the present invention is configured to control fluid in a channel of a channel chip, wherein the channel chip includes: a plurality of introduction channels; a common channel connected to the plurality of introduction channels; and a plurality of valves disposed for the plurality of introduction channels, each of the plurality of valves being disposed in each of the plurality of introduction channels or at a connecting portion between each of the introduction channel and the common channel; wherein the fluid handling device includes a rotary member rotatable around a central axis, the rotary member including: a first protrusion configured to close the plurality of valves by pressing a diaphragm of each of the plurality of valves; and a recess configured to open the plurality of valves without pressing the diaphragm of each of the plurality of valves, the first protrusion and the recess being disposed on a circumference of a first circle around the central axis; and wherein the rotary member further includes a second protrusion configured to close a valve of the plurality of valves that is opposite to the recess by pressing a diaphragm of the valve of the plurality of valves when the recess is located over the valve of the plurality of valves in a state where the rotary member is rotated.

A fluid handling system of an embodiment of the present invention includes: a channel chip including a plurality of introduction channels; a common channel connected to the plurality of introduction channels; and a plurality of valves disposed for the plurality of introduction channels, each of the plurality of valves being disposed in each of the plurality of introduction channels or at a connecting portion between each of the introduction channel and the common channel; and the fluid handling device.

Advantageous Effects of Invention

According to the present invention, it is possible to open and close a valve in an intended order by using a rotary member even when a channel chip includes a plurality of valves.

DESCRIPTION OF EMBODIMENTS

Embodiments of the present invention are elaborated below with reference to the accompanying drawings.

Embodiment 1

Configuration of Fluid Handling Device and Channel Chip

Figure 1A:
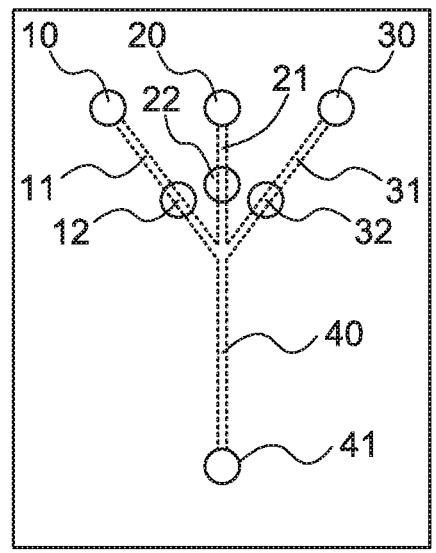
FIG. 1A is a plan view of a channel chip for describing a problem of a known technique.
Figure 1B:
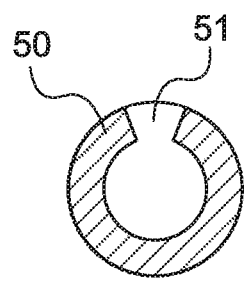
FIG. 1B is a bottom view of a rotary member combined with the channel chip illustrated in FIG. 1A.
Figure 2A:
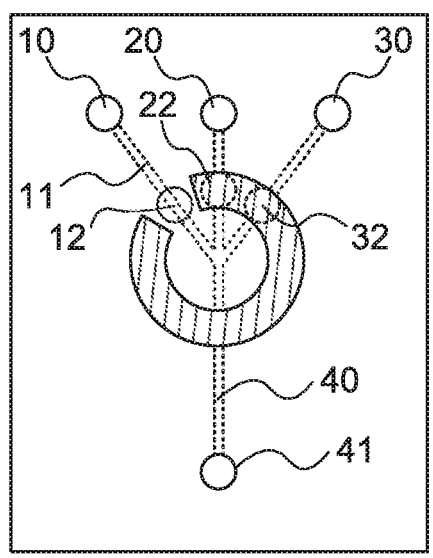
FIGS. 2A and 2B are schematic views illustrating an exemplary use of the channel chip illustrated in FIG. 1A and the rotary member illustrated in FIG. 1B.
Figure 2B:
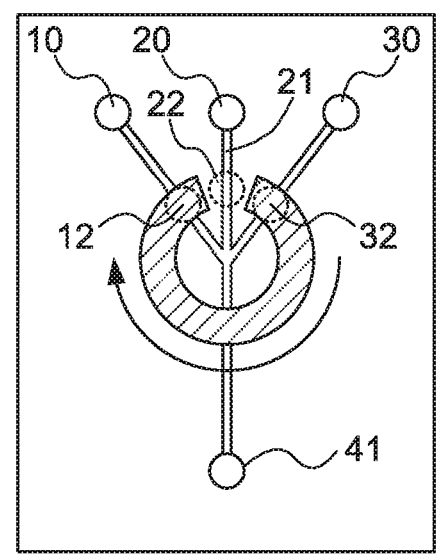
Figure 3:
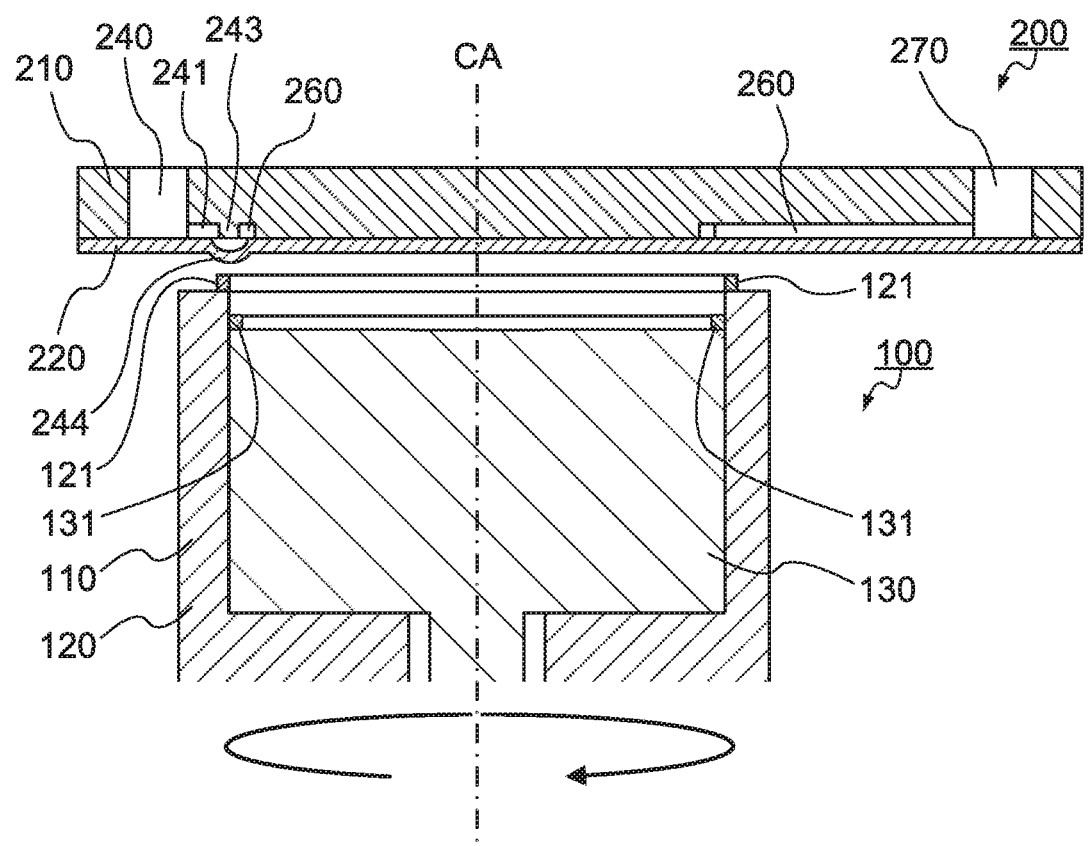
FIG. 3 is a sectional view illustrating a configuration of a fluid handling device and a channel chip according to Embodiment 1.

FIG. 3 is a sectional view (a sectional view taken along line A-A of FIG. 4) illustrating a configuration of a fluid handling system (fluid handling device 100 and channel chip 200) according to Embodiment 1. As illustrated in FIG. 3, fluid handling device 100 includes rotary member 110. Rotary member 110 is rotated around central axis CA by an external driving mechanism not illustrated in the drawing. Channel chip 200 includes substrate 210 and film 220, and is disposed to fluid handling device 100 such that film 220 is in contact with rotary member 110. In this specification, a combination of fluid handling device 100 and channel chip 200 is referred to also as "fluid handling system". Note that in FIG. 3, fluid handling device 100 and channel chip 200 are separated away from each other for the sake of clarity of illustration of their configurations.

Figure 4:
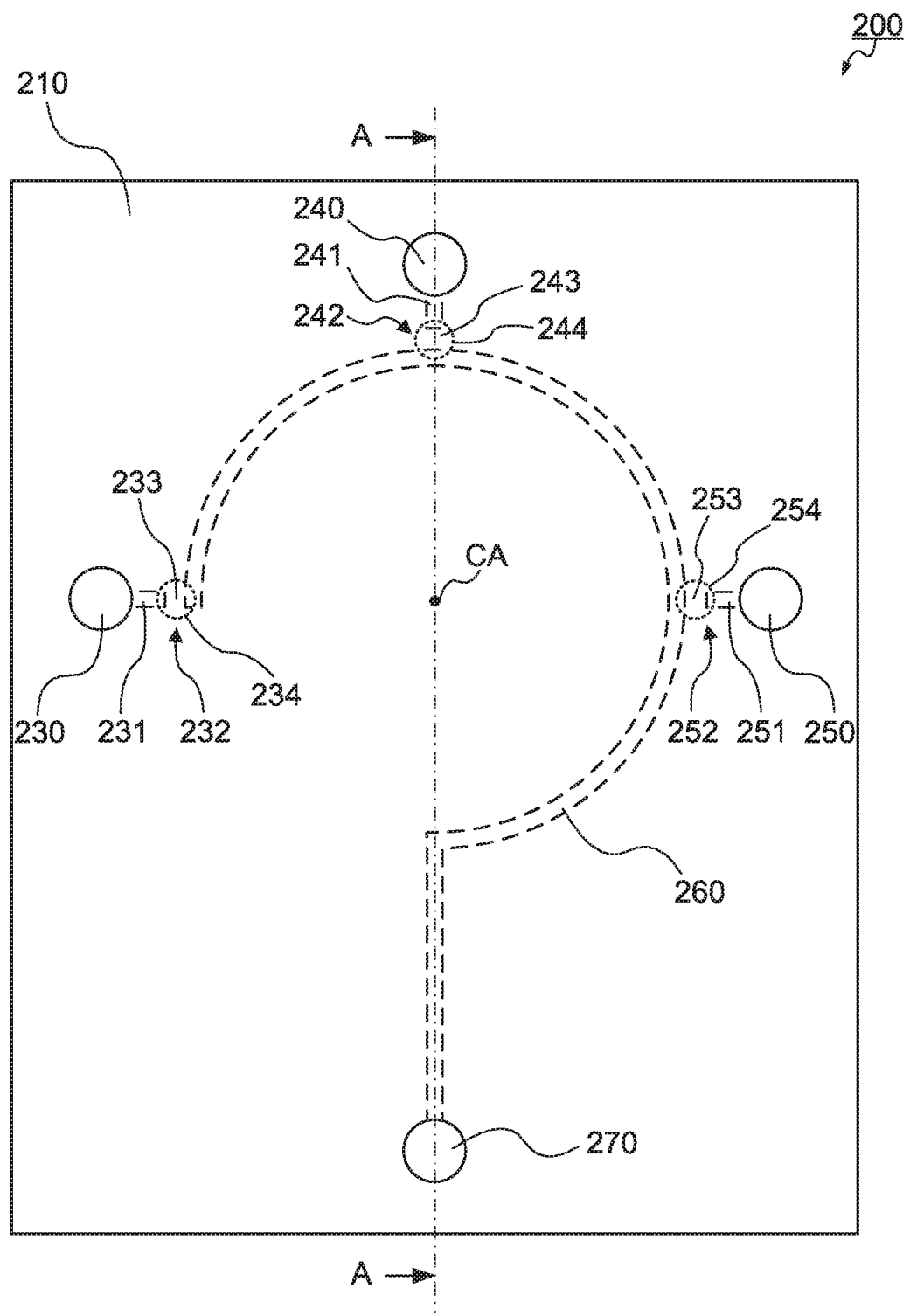
FIG. 4 is a plan view illustrating a configuration of the channel chip according to Embodiment 1.

FIG. 4 is a plan view illustrating a configuration of channel chip 200 according to Embodiment 1. In FIG. 4, a groove (channel) formed in the surface of substrate 210 on film 220 side and a diaphragm formed in film 220 are illustrated with broken lines.

As described above, channel chip 200 includes substrate 210 and film 220 (see FIG. 3). A groove configured to be a channel and a through hole configured to be an inlet or an outlet are formed in substrate 210. Film 220 is joined to one surface of substrate 210 so as to close the openings of the recess and the through hole formed in substrate 210. A partial region of film 220 functions as a diaphragm. The groove of substrate 210 closed with film 220 serves as a channel for carrying fluid such as reagent, liquid sample, gas, and powder.

The thickness of substrate 210 is not limited. For example, the thickness of substrate 210 is 1 mm to 10 mm In addition, the material of substrate 210 is not limited. For example, the material of substrate 210 may be appropriately selected from publicly known resins and glass. Examples of the material of substrate 210 include polyethylene terephthalate, polycarbonate, polymethylmethacrylate, polyvinyl chloride, polypropylene, polyether, polyethylene, polystyrene, silicone resin and elastomer.

The thickness of film 220 is not limited as long as it can serve as a diaphragm. For example, the thickness of film 220 is 30 μm to 300 μm. In addition, the material of film 220 is not limited as long as it can function as a diaphragm. For example, the material of film 220 may be appropriately selected from publicly known resins. Examples of the material of film 220 include polyethylene terephthalate, polycarbonate, polymethylmethacrylate, polyvinyl chloride, polypropylene, polyether, polyethylene, polystyrene, silicone resin and elastomer. Film 220 is joined to substrate 210 by thermal welding, laser welding, adhesive agent and the like, for example.

As illustrated in FIG. 4, channel chip 200 according to the present embodiment includes first inlet 230, first introduction channel 231, first valve 232, second inlet 240, second introduction channel 241, second valve 242, third inlet 250, third introduction channel 251, third valve 252, common channel 260 and outlet 270.

First inlet 230, second inlet 240 and third inlet 250 are bottomed recesses for introducing fluid. In the present embodiment, each of first inlet 230, second inlet 240 and third inlet 250 is composed of a through hole formed in substrate 210, and film 220 closing one opening of the through hole. The shape and the size of each inlet are not limited and may be appropriately set as necessary. Each inlet has a substantially columnar shape, for example. Each inlet has a width of about 2 mm, for example. The type of the fluid housed in each inlet may be appropriately selected in accordance with the use of channel chip 200. The fluid is fluid such as reagent, liquid sample and powder.

First introduction channel 231, second introduction channel 241 and third introduction channel 251 are channels in which fluid can move. The upstream ends of first introduction channel 231, second introduction channel 241 and third introduction channel 251 are connected to first inlet 230, second inlet 240 and third inlet 250, respectively. The downstream ends of first introduction channel 231, second introduction channel 241 and third introduction channel 251 are connected to common channel 260 at respective positions different from each other. In the present embodiment, each of first introduction channel 231, second introduction channel 241 and third introduction channel 251 is composed of a groove formed in substrate 210, and film 220 closing the opening of the groove. The cross-sectional area and the cross-sectional shape of each channel are not limited. In this specification, "cross-section of channel" means a cross-section of the channel orthogonal to the direction in which the fluid flows. The cross-sectional shape of each channel is a substantially rectangular shape with each side (width and depth) having a length of about several tens of micrometers, for example. The cross-sectional area of each channel may be or may not be constant in the flow direction of the fluid. In the present embodiment, the cross-sectional area of each channel is constant.

First valve 232, second valve 242 and third valve 252 are diaphragm valves that control the flow of the fluid in first introduction channel 231, second introduction channel 241 and third introduction channel 251, respectively. First valve 232 is disposed in first introduction channel 231 or at the connecting portion between first introduction channel 231 and common channel 260. Second valve 242 is disposed in second introduction channel 241 or at the connecting portion between second introduction channel 241 and common channel 260. Third valve 252 is disposed in third introduction channel 251 or at the connecting portion between third introduction channel 251 and common channel 260. In the present embodiment, first valve 232 is disposed at the connecting portion between first introduction channel 231 and common channel 260, second valve 242 is disposed at the connecting portion between second introduction channel 241 and common channel 260, and third valve 252 is disposed at the connecting portion between third introduction channel 251 and common channel 260. In addition, first valve 232, second valve 242 and third valve 252 are disposed on the circumference of a circle around central axis CA.

First valve 232 includes first partition wall 233 and first diaphragm 234. Likewise, second valve 242 includes second partition wall 243 and second diaphragm 244, and third valve 252 includes third partition wall 253 and third diaphragm 254. In the present embodiment, first partition wall 233 is disposed between first introduction channel 231 and common channel 260. Likewise, second partition wall 243 is disposed between second introduction channel 241 and common channel 260, and third partition wall 253 is disposed between third introduction channel 251 and common channel 260. In addition, first diaphragm 234 is disposed opposite to first partition wall 233. Likewise, second diaphragm 244 is disposed opposite to second partition wall 243, and third diaphragm 254 is disposed opposite to third partition wall 253.

First partition wall 233 functions as a valve seat of a diaphragm valve for opening and closing between first introduction channel 231 and common channel 260. Likewise, second partition wall 243 functions as a valve seat of a diaphragm valve for opening and closing between second introduction channel 241 and common channel 260, and third partition wall 253 functions as a valve seat of a diaphragm valve for opening and closing between third introduction channel 251 and common channel 260. The shape and the height of each partition wall are not limited as long as the above-mentioned function can be ensured. The shape of each partition wall is a rectangular prism shape, for example. The height of each partition wall is equal to the depth of the introduction channel and common channel 260, for example.

Each of first diaphragm 234, second diaphragm 244 and third diaphragm 254 is a portion of film 220 having flexibility and has a substantially spherical cap shape (see FIG. 3). Film 220 is disposed on substrate 210 such that each diaphragm is opposite to the corresponding partition wall without making contact with the partition wall. Each diaphragm deflects toward the corresponding partition wall when pressed by first protrusion 121 (described later) of rotary member 110. That is, the diaphragm functions as a valve element of a diaphragm valve. For example, when first protrusion 121 is not pressing first diaphragm 234, first introduction channel 231 and common channel 260 are communicated with each other through the gap between first diaphragm 234 and first partition wall 233. On the other hand, when first protrusion 121 is pressing first diaphragm 234 such that first diaphragm 234 makes contact with first partition wall 233, first introduction channel 231 and common channel 260 are not communicated with each other.

Common channel 260 is a channel in which fluid can move. Common channel 260 is connected to first introduction channel 231 through first valve 232, and connected to second introduction channel 241 through second valve 242. Further, common channel 260 is connected to third introduction channel 251 through third valve 252. Accordingly, fluid introduced to first inlet 230, fluid introduced to second inlet 240, and fluid introduced to third inlet 250 flow through common channel 260. The downstream end of common channel 260 is connected to outlet 270. In the present embodiment, common channel 260 is composed of the groove formed in substrate 210, and film 220 closing the opening of the groove. The cross-sectional area and the cross-sectional shape of common channel 260 are not limited. The cross-sectional shape of common channel 260 is a substantially rectangular shape with each side (width and depth) having a length of about several tens of micrometers, for example. The cross-sectional area of common channel 260 may be or may not be constant in the flow direction of the fluid. In the present embodiment, the cross-sectional area of common channel 260 is constant.

Outlet 270 is a bottomed recess. Outlet 270 functions as an air hole, and as an ejection port for ejecting the fluid in common channel 260. In the present embodiment, outlet 270 is composed of a through hole formed in substrate 210 and film 220 closing one opening of the through hole. The shape and the size of outlet 270 are not limited, and may be appropriately set as necessary. The shape of outlet 270 is a substantially columnar shape, for example. The width of outlet 270 is about 2 mm, for example.

Figure 5A:
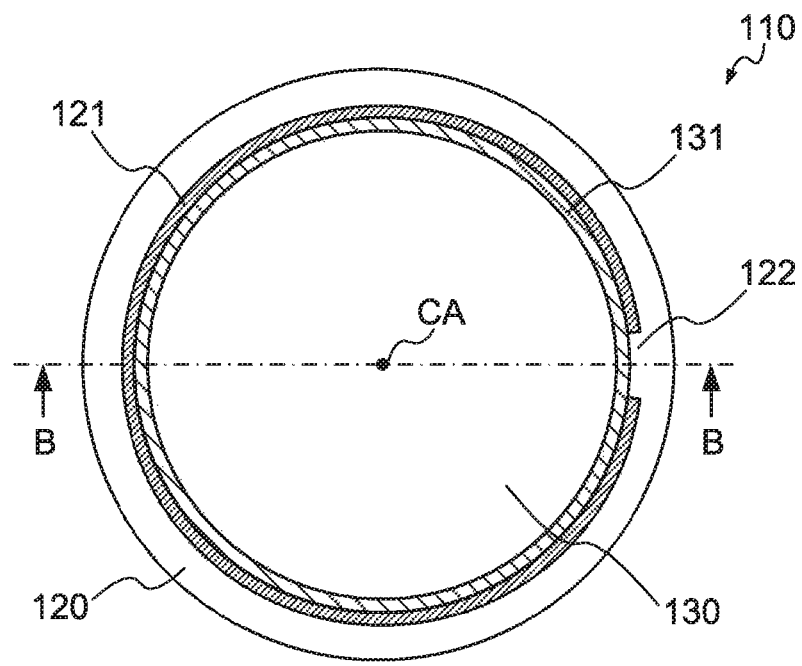
FIG. 5A is a plan view of a rotary member according to Embodiment 1.
Figure 5B:
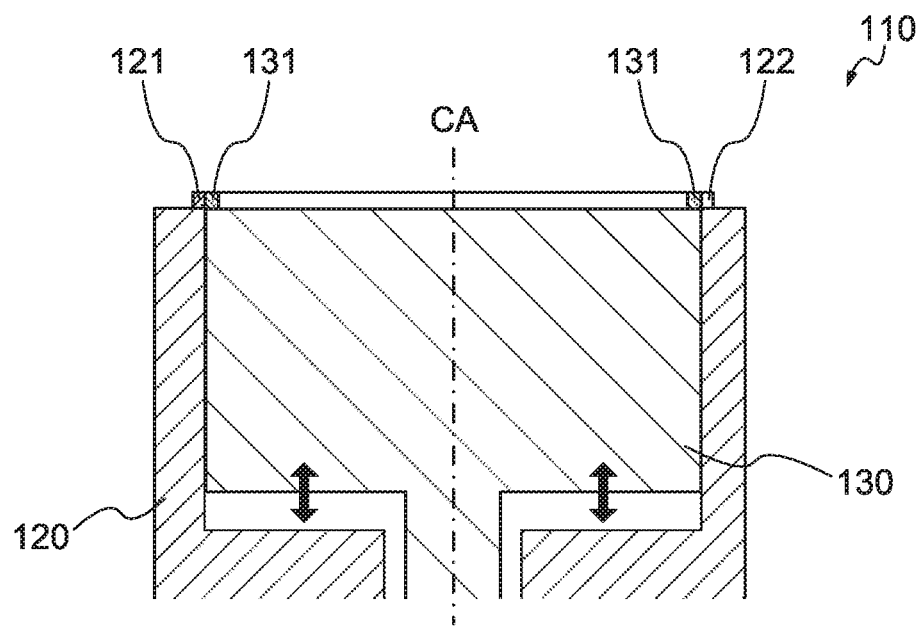
FIG. 5B is a sectional view taken along line B-B of FIG. 5A.

FIG. 5A is a plan view of rotary member 110 of fluid handling device 100 according to Embodiment 1, and FIG. 5B is a sectional view taken along line B-B of FIG. 5A. In FIG. 5A, for the sake of clarity, the top surface of first protrusion 121 and the top surface of second protrusion 131 are hatched. Note that the sectional view of rotary member 110 illustrated in FIG. 3 and the sectional view of rotary member 110 illustrated in FIG. 5B are different from each other in the position of sliding part 130 with respect to body 120.

Rotary member 110 includes cylindrical body 120, and sliding part 130 disposed inside body 120. Body 120 is rotatable around central axis CA. Sliding part 130 is movable in the direction along central axis CA (see FIGS. 3 and 5B). Sliding part 130 may or may not rotate together with body 120. At least body 120 is rotated by an external driving mechanism not illustrated in the drawing, and sliding part 130 is moved in the direction along central axis CA by the external driving mechanism not illustrated in the drawing.

In the upper part of body 120, first protrusion 121 configured to close first valve 232, second valve 242 or third valve 252 by pressing first diaphragm 234, second diaphragm 244 or third diaphragm 254, and recess 122 configured to open first valve 232, second valve 242 or third valve 252 without pressing first diaphragm 234, second diaphragm 244 or third diaphragm 254 are provided. First protrusion 121 and recess 122 are disposed on the circumference of the first circle around central axis CA. In the present embodiment, first protrusion 121 has an arc-like shape corresponding to a portion of the first circle around central axis CA in plan view. The region where first protrusion 121 is not present on the circumference of the first circle is recess 122.

Note that it suffices that first protrusion 121 is relatively protruded than recess 122, and that recess 122 is relatively recessed than first protrusion 121. That is, it suffices that first protrusion 121 can function as a pressing part, and that recess 122 can function as a non-pressing part. For example, in the example illustrated in FIG. 5B, first protrusion 121 is protruded from the top surface (reference surface) of body 120, and the bottom surface of recess 122 is at the same height as the top surface (reference surface) of body 120. Conversely, the top surface of first protrusion 121 may be at the same height as the top surface (reference surface) of body 120, and in this case, recess 122 is recessed from the top surface (reference surface) of body 120.

On the other hand, second protrusion 131 is provided in the upper part of sliding part 130. Second protrusion 131 is configured to press the diaphragm of the valve facing recess 122 to close the valve when recess 122 is located over first valve 232, second valve 242 or third valve 252 in the state where rotary member 110 (body 120) is rotated. Second protrusion 131 is disposed on the circumference of the second circle around central axis CA inside or outside the first circle in rotary member 110. In the present embodiment, second protrusion 131 is disposed on the circumference of the second circle around central axis CA inside the first circle. In the present embodiment, second protrusion 131 has a circular shape corresponding to the entire circumference of the second circle in plan view. As described above, sliding part 130 is movable in the direction along central axis CA (see FIGS. 3 and 5B). Accordingly, second protrusion 131 can be switched between a state that can make contact with the diaphragm of each valve and a state that cannot make contact with the diaphragm of each valve.

Note that second protrusion 131 may not be protruded from the top surface (reference surface) of sliding part 130 as long as second protrusion 131 can be switched between a state that can make contact with the diaphragm of each valve and a state that cannot make contact with the diaphragm of each valve. That is, it suffices that second protrusion 131 can function as a pressing part. While second protrusion 131 is protruded from the top surface (reference surface) of sliding part 130 in the example illustrated in FIG. 5B, the top surface of second protrusion 131 may be at the same height as the top surface (reference surface) of sliding part 130.

Operation of Fluid Handling Device

Figure 6:
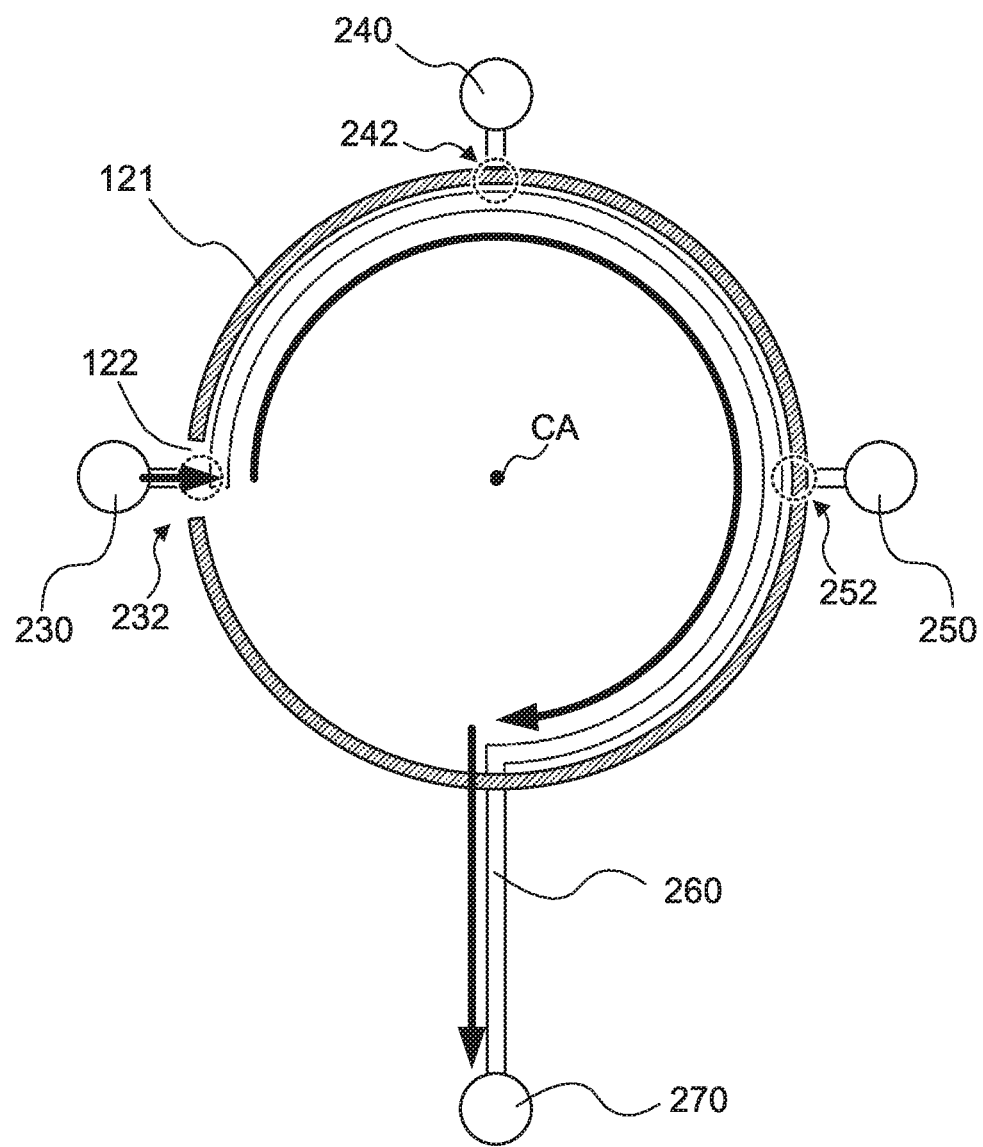
FIG. 6 is a schematic view for describing an operation of the fluid handling device according to Embodiment 1.
Figure 7:
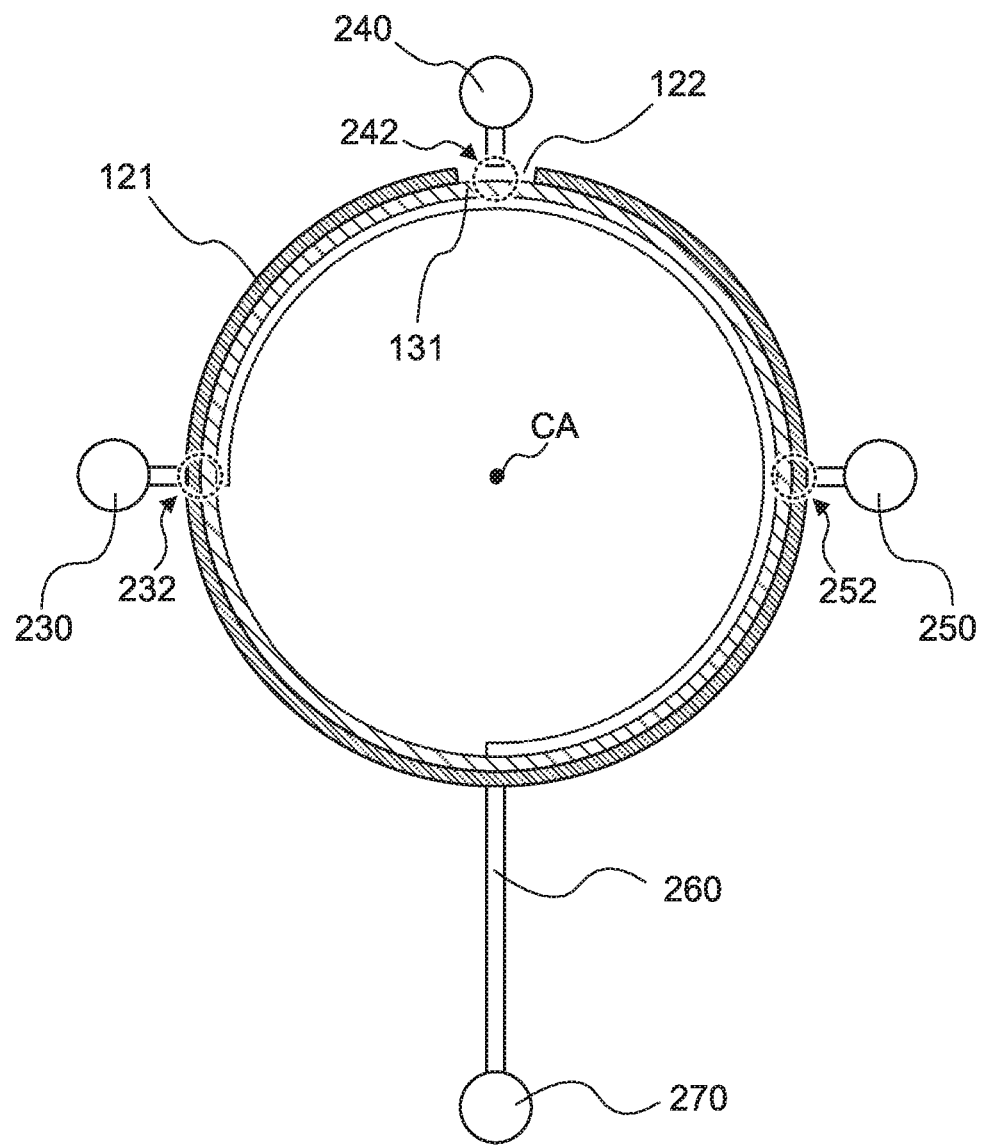
FIG. 7 is a schematic view for describing an operation of the fluid handling device according to Embodiment 1.
Figure 8:
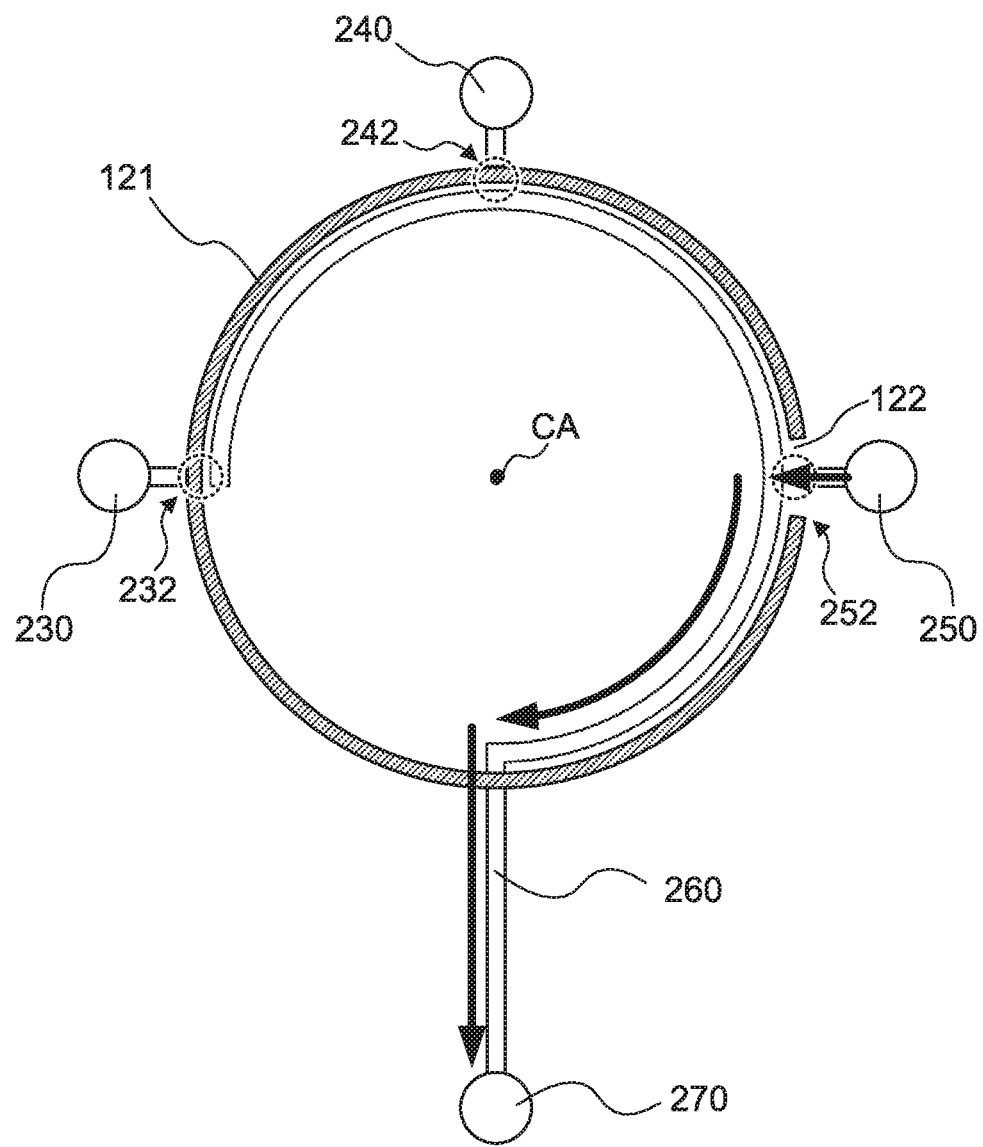
FIG. 8 is a schematic view for describing an operation of the fluid handling device according to Embodiment 1.

Next, with reference to FIGS. 6 to 8, an operation of fluid handling device 100 is described. For convenience of description, in FIGS. 6 to 8, first protrusion 121 and second protrusion 131 are hatched when they are in contact with film 220 of channel chip 200, and are not hatched when they are not in contact with film 220 of channel chip 200. Assume that first liquid is housed in first inlet 230, second liquid is housed in second inlet 240, third liquid is housed in third inlet 250, and that a pressure is exerted on first inlet 230, second inlet 240 and third inlet 250.

First, rotary member 110 (body 120) is rotated such that recess 122 is located over first valve 232 and that first protrusion 121 is located over second valve 242 and third valve 252 to open first valve 232 and close second valve 242 and third valve 252. In addition, sliding part 130 is moved such that second protrusion 131 does not make contact with film 220 of channel chip 200. In this manner, as illustrated in FIG. 6, the first liquid in first inlet 230 moves to outlet 270 through first introduction channel 231, first valve 232 and common channel 260. At this time, second valve 242 and third valve 252 are closed, and therefore the second liquid in second inlet 240 and the third liquid in third inlet 250 do not flow into common channel 260.

Next, assume that the third liquid in third inlet 250 is to be caused to flow through common channel 260. In this case, rotary member 110 (body 120) is required to be rotated until recess 122 is located over third valve 252. At this time, rotary member 110 (body 120) is rotated after sliding part 130 is moved such that second protrusion 131 makes contact with film 220 of channel chip 200. As illustrated in FIG. 7, even when recess 122 is located over second valve 242 while rotary member 110 (body 120) is being rotated, second diaphragm 244 of second valve 242 is pressed by second protrusion 131. Accordingly, even when recess 122 passes over second valve 242 while rotary member 110 (body 120) is being rotated, the second liquid in second inlet 240 does not flow into common channel 260.

Then, when recess 122 is located over third valve 252 and first protrusion 121 is located over first valve 232 and second valve 242, the rotation of rotary member 110 (body 120) is stopped. In addition, sliding part 130 is moved such that second protrusion 131 does not make contact with film 220 of channel chip 200. In this manner, only third valve 252 is opened. In this manner, as illustrated in FIG. 8, the third liquid in third inlet 250 moves to outlet 270 through third introduction channel 251, third valve 252 and common channel 260. At this time, first valve 232 and second valve 242 are closed, and therefore the first liquid in first inlet 230 and the second liquid in second inlet 240 do not flow into common channel 260.

Through the above-mentioned procedure, the opening and closing of the plurality of valves can be controlled by rotating rotary member 110 (body 120) without opening unintended valves while rotary member 110 (body 120) is being rotated.

Effect

As described above, fluid handling device 100 according to Embodiment 1 can prevent unintended valves from being opened while rotary member 110 (body 120) is being rotated, by rotating rotary member 110 (body 120) in the state where second protrusion 131 is in contact with film 220 of channel chip 200. Accordingly, fluid handling device 100 according to Embodiment 1 can open and close the valves in the intended order by using rotary member 110 even when channel chip 200 includes a plurality of valves.

Embodiment 2

Configuration of Fluid Handling Device and Channel Chip

A fluid handling system (fluid handling device 300 and channel chip 200) according to Embodiment 2 differs from fluid handling device 100 and channel chip 200 according to Embodiment 1 only in configuration of rotary member 310. In view of this, the same components as those of fluid handling device 100 and channel chip 200 according to Embodiment 1 are denoted by the same reference numerals, and the descriptions thereof are omitted.

Fluid handling device 300 according to Embodiment 2 is a fluid handling device configured to control the fluid in the channel of channel chip 200 illustrated in FIG. 4, and includes rotary member 310.

Figure 9A:
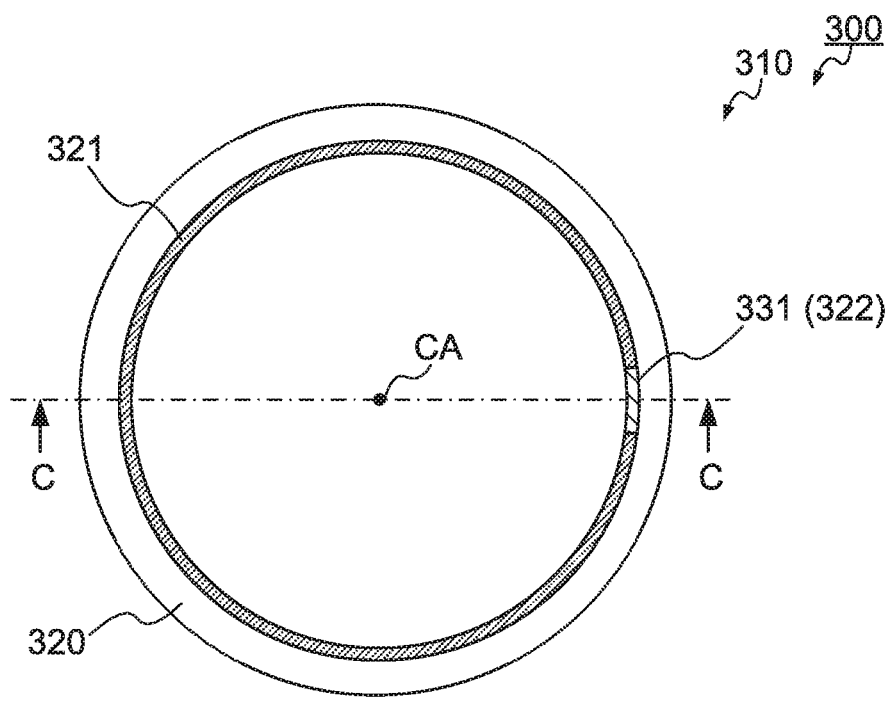
FIG. 9A is a plan view of a rotary member according to Embodiment 2.
Figure 9B:
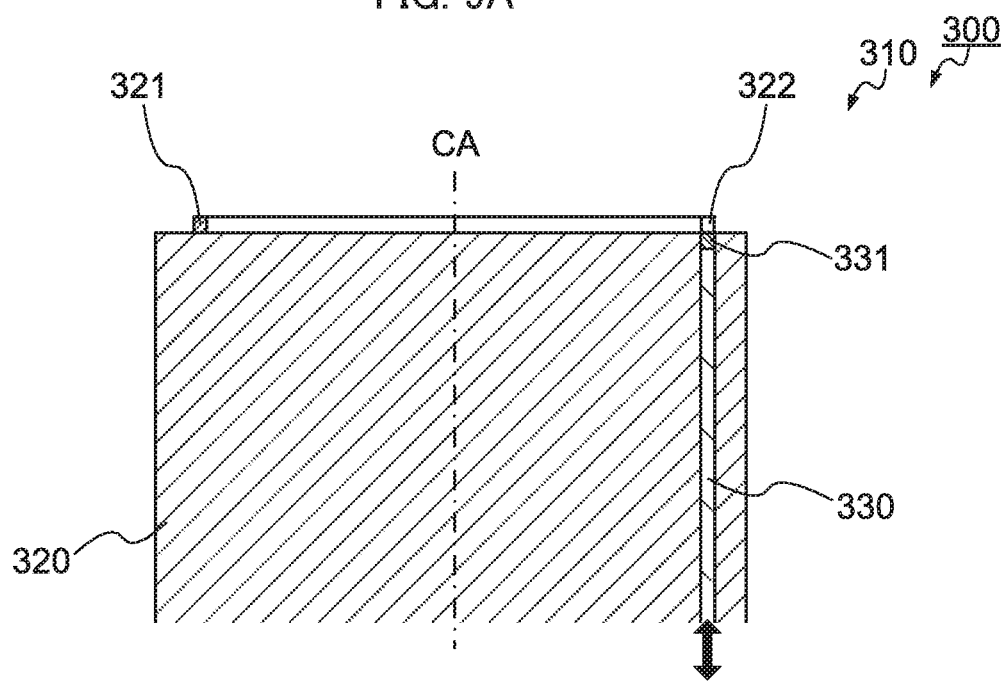
FIG. 9B is a sectional view taken along line C-C of FIG. 9A.

FIG. 9A is a plan view of rotary member 310 of fluid handling device 300 according to Embodiment 2, and FIG. 9B is a sectional view taken along line C-C of FIG. 9A. In FIG. 9A, for the sake of clarity, the top surface of first protrusion 321 and the top surface of second protrusion 331 are hatched.

Rotary member 310 includes columnar body 320, and sliding part 330 disposed in a through hole provided in body 320. Body 320 is rotatable around central axis CA. Sliding part 330 is movable in the direction along central axis CA. Body 320 is rotated by an external driving mechanism not illustrated in the drawing, and sliding part 330 is moved in the direction along central axis CA by the external driving mechanism not illustrated in the drawing.

In the upper part of body 320, first protrusion 321 configured to close first valve 232, second valve 242 or third valve 252 by pressing first diaphragm 234, second diaphragm 244 or third diaphragm 254, and recess 322 configured to open first valve 232, second valve 242 or third valve 252 without pressing first diaphragm 234, second diaphragm 244 or third diaphragm 254 are provided. First protrusion 321 and recess 322 are disposed on the circumference of the first circle around central axis CA. In the present embodiment, first protrusion 321 has an arc-like shape corresponding to a portion of the first circle around central axis CA in plan view. The region where first protrusion 321 is not present on the circumference of the first circle is recess 322.

Note that it suffices that first protrusion 321 is relatively protruded than recess 322, and that recess 322 is relatively recessed than first protrusion 321. That is, it suffices that first protrusion 321 can function as a pressing part, and that recess 322 can function as a non-pressing part. For example, in the example illustrated in FIG. 9B, first protrusion 321 is protruded from the top surface (reference surface) of body 320, and the bottom surface of recess 322 is at the same height as the top surface (reference surface) of body 320. Conversely, the top surface of first protrusion 321 may be at the same height as the top surface (reference surface) of body 320, and in this case, recess 322 is recessed from the top surface (reference surface) of body 320.

On the other hand, second protrusion 331 is provided in the upper part of sliding part 330. Second protrusion 331 is configured to press the diaphragm of the valve facing recess 322 to close the valve when recess 322 is located over first valve 232, second valve 242 or third valve 252 in the state where rotary member 310 (body 320) is rotated. Second protrusion 331 is disposed at the same position as recess 322 on the circumference of the first circle. As described above, sliding part 330 is movable in the direction along central axis CA (see FIGS. 3 and 5B). Accordingly, second protrusion 331 can be switched between a state that can make contact with the diaphragm of each valve and a state that cannot make contact with the diaphragm of each valve.

Note that second protrusion 331 may not be protruded from the top surface (reference surface) of sliding part 330 as long as second protrusion 331 can be switched between a state that can make contact with the diaphragm of each valve and a state that cannot make contact with the diaphragm of each valve. That is, it suffices that second protrusion 331 can function as a pressing part. While second protrusion 331 is protruded from the top surface (reference surface) of sliding part 330 in the example illustrated in FIG. 9B, the top surface of second protrusion 331 may be at the same height as the top surface (reference surface) of sliding part 330.

Operation of Fluid Handling Device

Figure 10:
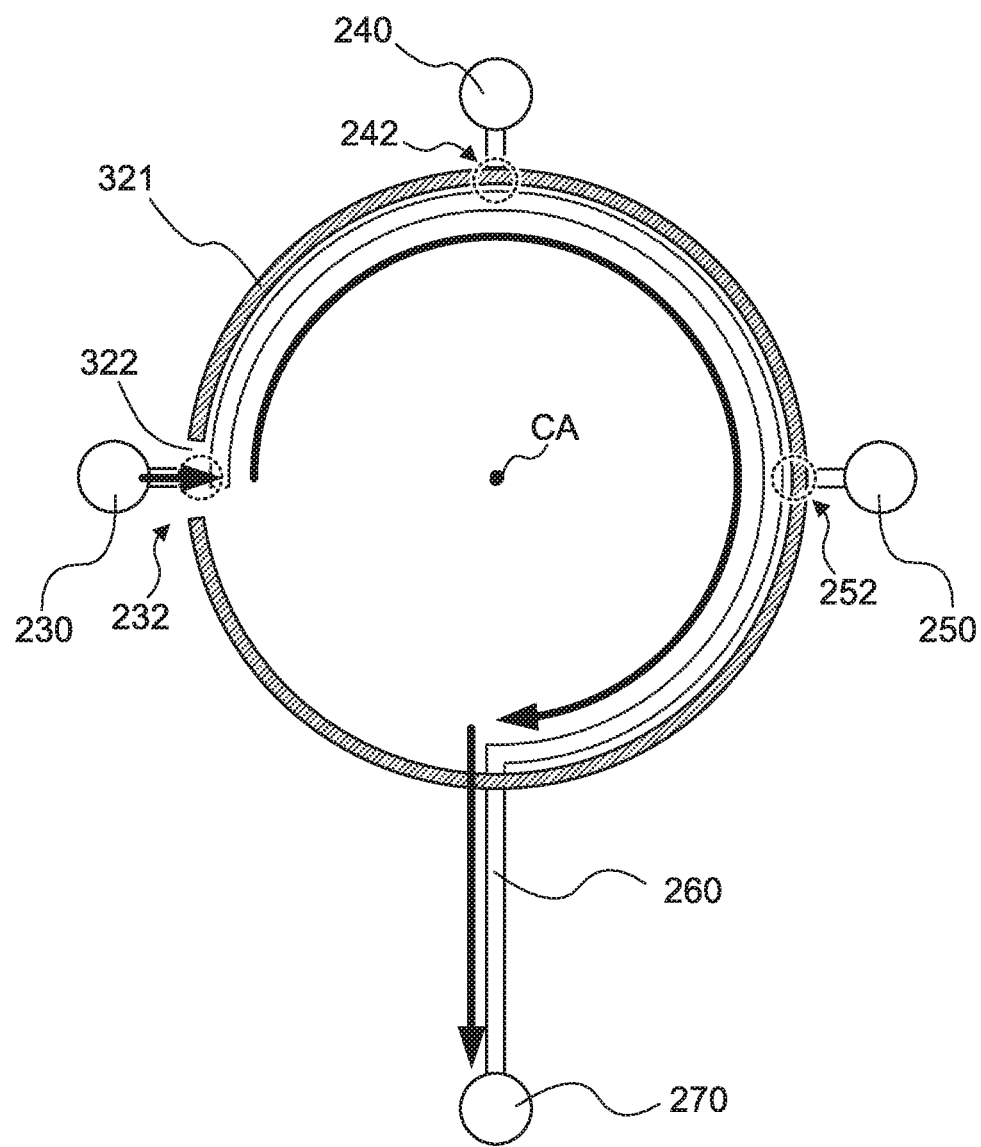
FIG. 10 is a schematic view for describing an operation of a fluid handling device according to Embodiment 2.
Figure 11:
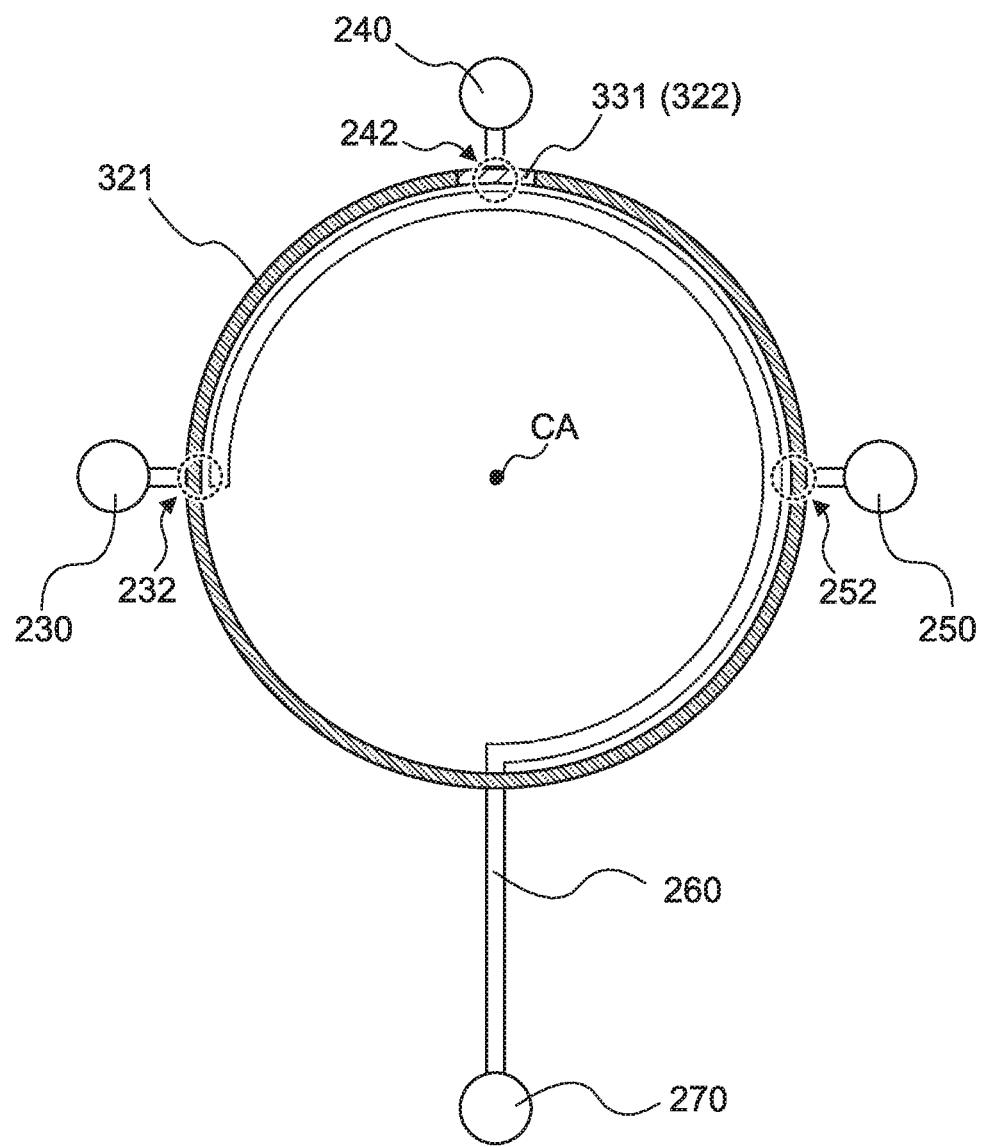
FIG. 11 is a schematic view for describing an operation of the fluid handling device according to Embodiment 2.
Figure 12:
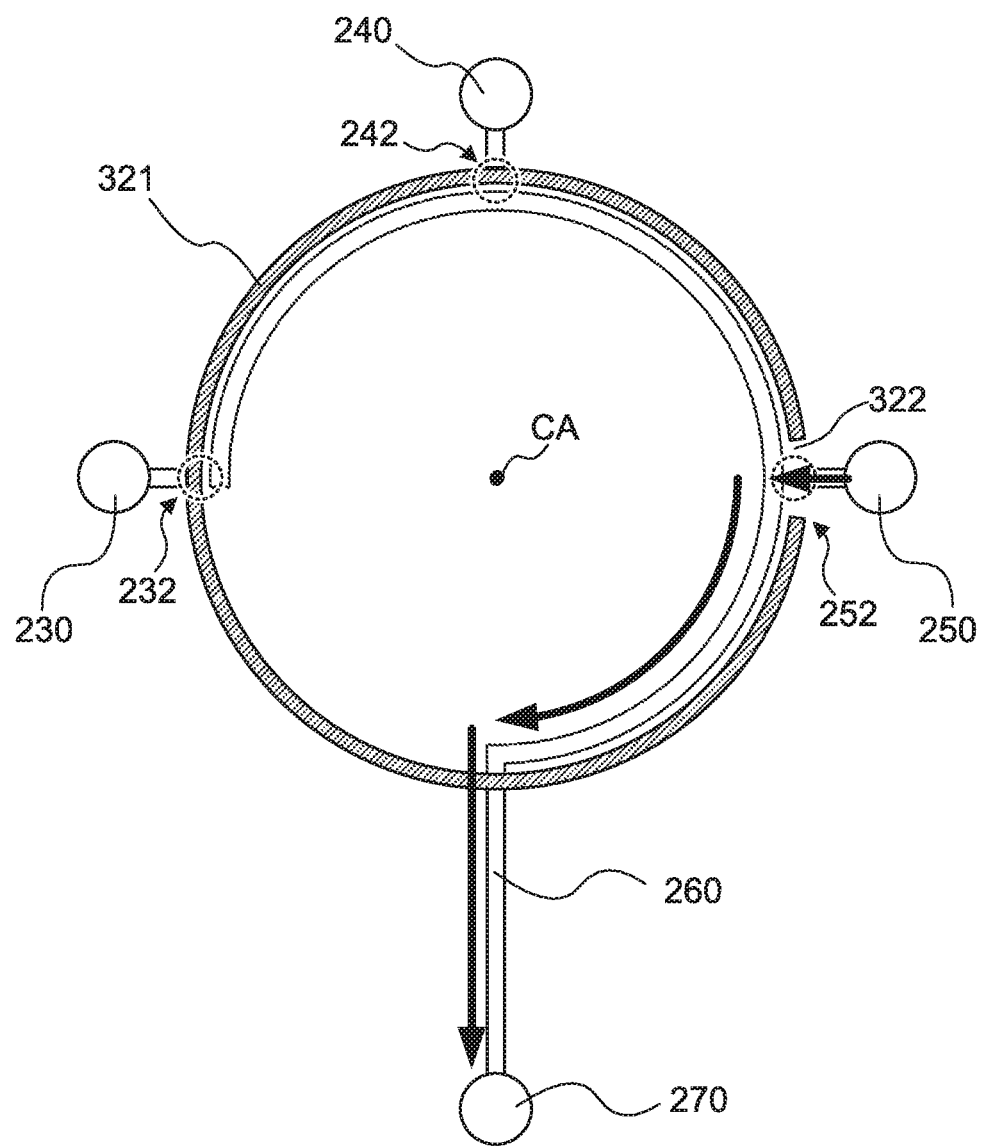
FIG. 12 is a schematic view for describing an operation of the fluid handling device according to Embodiment 2.

Next, with reference to FIGS. 10 to 12, an operation of fluid handling device 300 is described. For convenience of description, in FIGS. 10 to 12, first protrusion 321 and second protrusion 331 are hatched when they are in contact with film 220 of channel chip 200, and are not hatched when they are not in contact with film 220 of channel chip 200. Assume that first liquid is housed in first inlet 230, second liquid is housed in second inlet 240, third liquid is housed in third inlet 250, and that a pressure is exerted on first inlet 230, second inlet 240 and third inlet 250.

First, rotary member 310 (body 320) is rotated such that recess 322 is located over first valve 232 and first protrusion 321 is located over second valve 242 and third valve 252, to open first valve 232 and close second valve 242 and third valve 252. In addition, sliding part 330 is moved such that second protrusion 331 does not make contact with film 220 of channel chip 200. In this manner, as illustrated in FIG. 10, the first liquid in first inlet 230 moves to outlet 270 through first introduction channel 231, first valve 232 and common channel 260. At this time, second valve 242 and third valve 252 are closed, and therefore the second liquid in second inlet 240 and the third liquid in third inlet 250 do not flow into common channel 260.

Next, assume that the third liquid in third inlet 250 is to be caused to flow through common channel 260. In this case, rotary member 310 (body 320) is required to be rotated until recess 322 is located over third valve 252. At this time, rotary member 310 (body 320) is rotated after sliding part 330 is moved such that second protrusion 331 makes contact with film 220 of channel chip 200. As illustrated in FIG. 11, second diaphragm 244 of second valve 242 is pressed by second protrusion 331 even when recess 322 is located over second valve 242 while rotary member 310 (body 320) is being rotated. Accordingly, the second liquid in second inlet 240 does not flow into common channel 260 even when recess 322 passes over second valve 242 while rotary member 310 (body 320) is being rotated.

Then, when recess 322 is located over third valve 252 and first protrusion 321 is located over first valve 232 and second valve 242, the rotation of rotary member 310 (body 320) is stopped. In addition, sliding part 330 is moved such that second protrusion 331 does not make contact with film 220 of channel chip 200. In this manner, only third valve 252 is opened. In this manner, as illustrated in FIG. 12, the third liquid in third inlet 250 moves to outlet 270 through third introduction channel 251, third valve 252 and common channel 260. At this time, first valve 232 and second valve 242 are closed, and therefore the first liquid in first inlet 230 and the second liquid in second inlet 240 do not flow into common channel 260.

Through the above-mentioned procedure, the opening and closing of the plurality of valves can be controlled by rotating rotary member 310 (body 320) without opening unintended valves while rotary member 310 (body 320) is being rotated.

Effect

Fluid handling device 300 according to Embodiment 2 has an effect similar to that of fluid handling device 100 according to Embodiment 1.

Embodiment 3

Configuration of Fluid Handling Device and Channel Chip

Fluid handling device 400 according to Embodiment 3 includes rotary member 410. Rotary member 410 is rotated around central axis CA by an external driving mechanism not illustrated in the drawing. Fluid handling device 400 is used in the state where channel chip 500 is installed over rotary member 410 (see FIG. 3). In the fluid handling system (fluid handling device 400 and channel chip 500) according to Embodiment 3, the same components as those of fluid handling device 100 and channel chip 200 according to Embodiment 1 are denoted by the same reference numerals, and the descriptions thereof are omitted.

Figure 13:
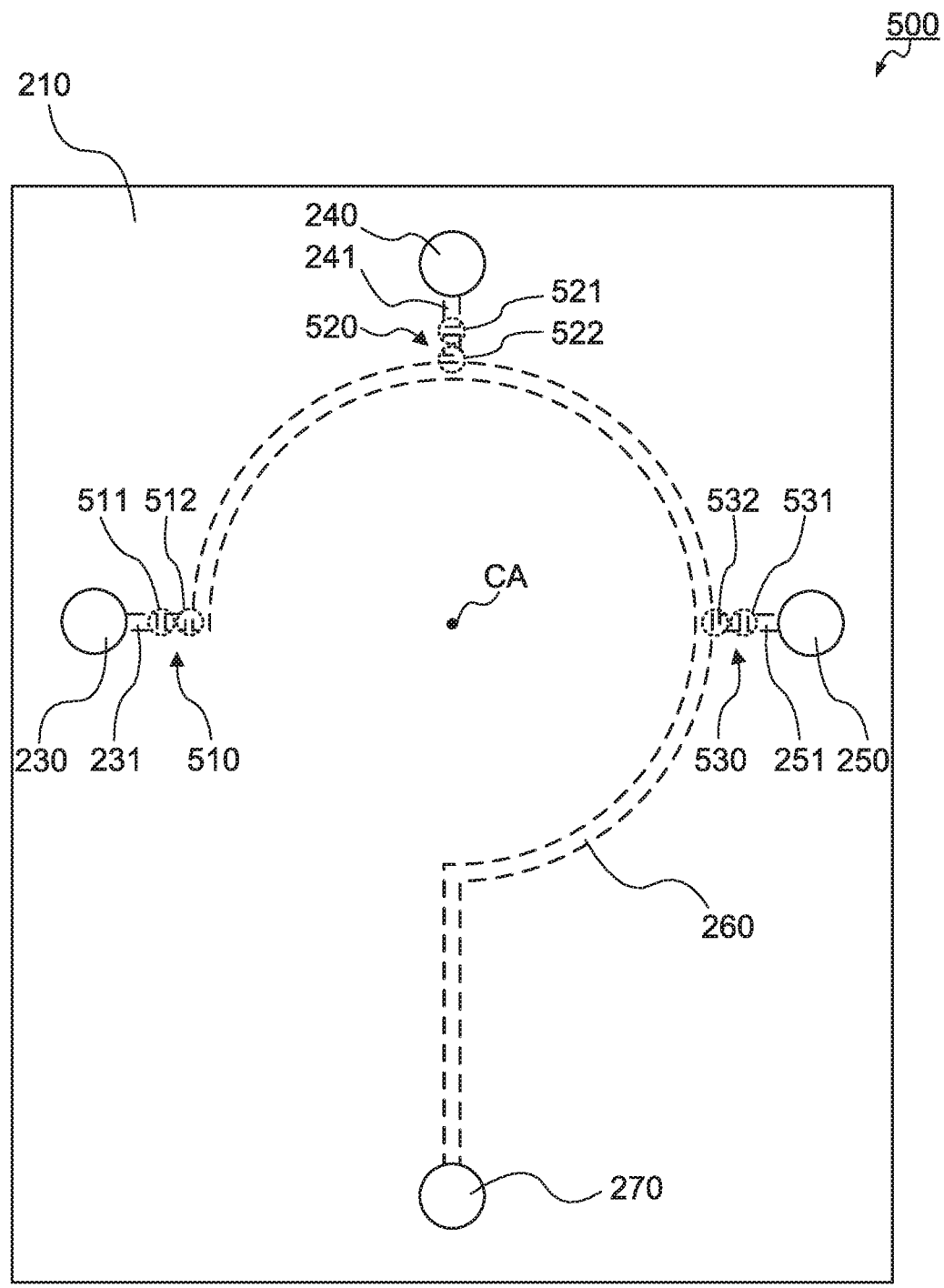
FIG. 13 is a plan view illustrating a configuration of a channel chip according to Embodiment 3.

FIG. 13 is a plan view illustrating a configuration of channel chip 500 according to Embodiment 3. Channel chip 500 includes substrate 210 and film 220, and is installed to fluid handling device 400 such that film 220 makes contact with rotary member 410. In FIG. 13, a groove (channel) formed in the surface of substrate 210 on film 220 side and a diaphragm formed in film 220 are illustrated with broken lines.

As illustrated in FIG. 13, channel chip 500 according to the present embodiment includes first inlet 230, first introduction channel 231, first valve 510, second inlet 240, second introduction channel 241, second valve 520, third inlet 250, third introduction channel 251, third valve 530, common channel 260 and outlet 270. Components other than first valve 510, second valve 520 and third valve 530 are identical to the components of channel chip 200 according to Embodiment 1.

First valve 510, second valve 520 and third valve 530 control the flow of the fluid in first introduction channel 231, second introduction channel 241 and third introduction channel 251, respectively. First valve 510 is disposed in first introduction channel 231 or at the connecting portion between first introduction channel 231 and common channel 260. Second valve 520 is disposed in second introduction channel 241 or at the connecting portion between second introduction channel 241 and common channel 260. Third valve 530 is disposed in third introduction channel 251 or at the connecting portion between third introduction channel 251 and common channel 260.

First valve 510 is composed of first sub valve 511 and second sub valve 512 disposed next to each other in first introduction channel 231. Likewise, second valve 520 is composed of first sub valve 521 and second sub valve 522 disposed next to each other in second introduction channel 241, and third valve 530 is composed of first sub valve 531 and second sub valve 532 disposed next to each other in third introduction channel 251. For example, when both first sub valve 511 and second sub valve 512 are open in first valve 510, first valve 510 is open in its entirety. On the other hand, at least one of first sub valve 511 and second sub valve 512 is closed, first valve 510 is closed in its entirety. The same applies to second valve 520 and third valve 530. First sub valves 511, 521 and 531 of the valves are disposed on the circumference of a circle around central axis CA. In addition, second sub valves 512, 522 and 532 of the valves are disposed on the circumference of another circle around central axis CA. In the present embodiment, second sub valves 512, 522 and 532 of the valves are disposed on central axis CA side relative to first sub valves 511, 521 and 531 of the valves.

Each sub valve includes a partition wall and a diaphragm. The partition wall functions as the valve seat of the diaphragm valve. The shape and the height of each partition wall are not limited as long as the above-mentioned function can be ensured. The shape of each partition wall is a rectangular prism shape, for example. The height of each partition wall is equal to the depth of the introduction channel and common channel 260, for example. The diaphragm is a portion of film 220 having flexibility, and has a substantially spherical cap shape. Film 220 is disposed on substrate 210 such that each diaphragm is opposite to the corresponding partition wall without making contact with the partition wall. Each diaphragm deflects toward the corresponding partition wall when pressed by first protrusion 421 or second protrusion 431 (described later) of rotary member 410. That is, the diaphragm functions as a valve element of a diaphragm valve.

Figure 14A:
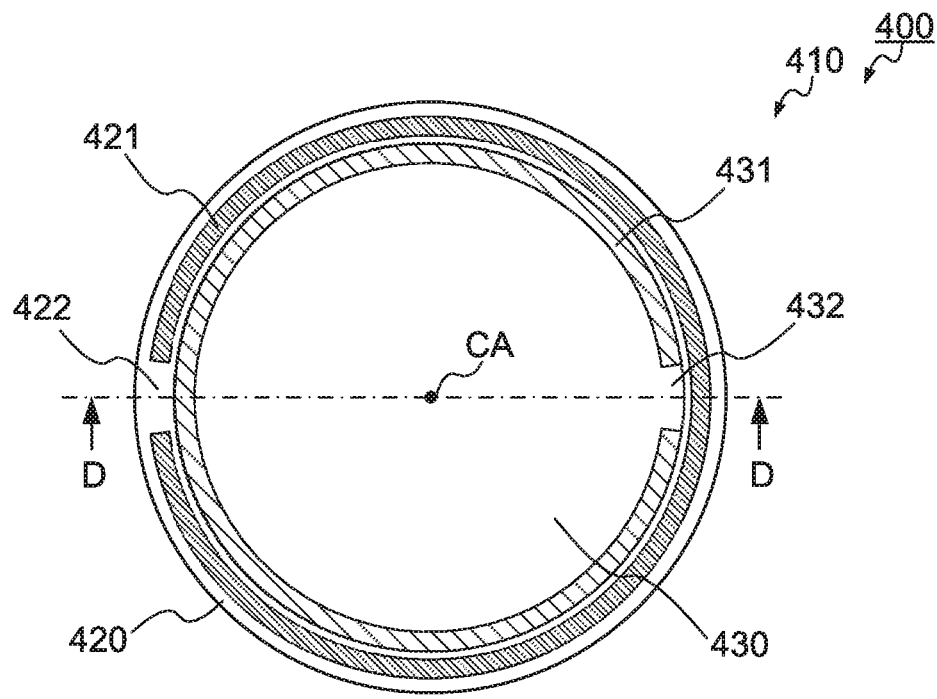
FIG. 14A is a plan view of a rotary member according to Embodiment 3.
Figure 14B:
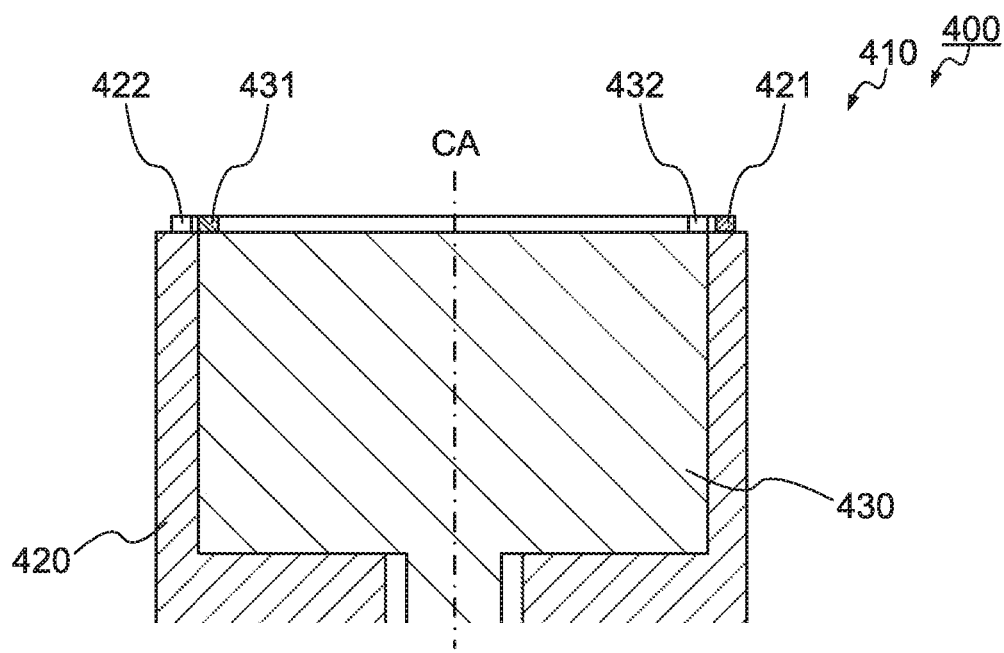
FIG. 14B is a sectional view taken along line D-D of FIG. 14A.

FIG. 14A is a plan view of rotary member 410 of fluid handling device 400 according to Embodiment 3, and FIG. 14B is a sectional view taken along line D-D of FIG. 14A. In FIG. 14A, for the sake of clarity, the top surface of first protrusion 421 and the top surface of second protrusion 431 are hatched.

Rotary member 410 includes cylindrical first body 420, and columnar second body 430 disposed inside first body 420. First body 420 and second body 430 are rotatable independently from each other around central axis CA. First body 420 and second body 430 are rotated by an external driving mechanism not illustrated in the drawing.

In the upper part of first body 420, first protrusion 421 configured to close first sub valve 511 of first valve 510, first sub valve 521 of second valve 520 or first sub valve 531 of third valve 530 by pressing the diaphragm, and first recess 422 configured to open first sub valve 511 of first valve 510, first sub valve 521 of second valve 520 or first sub valve 531 of third valve 530 without pressing the diaphragm are provided. First protrusion 421 and first recess 422 are disposed on the circumference of the first circle around central axis CA. In the present embodiment, first protrusion 421 has an arc-like shape corresponding to a portion of the first circle around central axis CA in plan view. The region where first protrusion 421 is not present on the circumference of the first circle is first recess 422.

Note that it suffices that first protrusion 421 is relatively protruded than first recess 422, and that first recess 422 is relatively recessed than first protrusion 421. That is, it suffices that first protrusion 421 can function as a pressing part, and that first recess 422 can function as a non-pressing part. For example, in the example illustrated in FIG. 14B, first protrusion 421 is protruded from the top surface (reference surface) of first body 420, and the bottom surface of first recess 422 is at the same height as the top surface (reference surface) of first body 420. Conversely, the top surface of first protrusion 421 may be at the same height as the top surface (reference surface) of first body 420, and in this case, first recess 422 is recessed from the top surface (reference surface) of first body 420.

On the other hand, in the upper part of second body 430, second protrusion 431 configured to close second sub valve 512 of first valve 510, second sub valve 522 of second valve 520 or second sub valve 532 of third valve 530 by pressing the diaphragm, and second recess 432 configured to open second sub valve 512 of first valve 510, second sub valve 522 of second valve 520 or second sub valve 532 of third valve 530 without pressing the diaphragm are provided. Second protrusion 431 and second recess 432 are disposed on the circumference of the second circle around central axis CA inside or outside the first circle in rotary member 410. In the present embodiment, second protrusion 431 is disposed on the circumference of the second circle around central axis CA inside the first circle. In the present embodiment, second protrusion 431 has an arc-like shape corresponding to a portion of the second circle around central axis CA in plan view. The region where second protrusion 431 is not present on the circumference of the second circle is second recess 432.

Note that it suffices that second protrusion 431 is relatively protruded than second recess 432, and that second recess 432 is relatively recessed than second protrusion 431. That is, it suffices that second protrusion 431 can function as a pressing part, and that second recess 432 can function as a non-pressing part. For example, in the example illustrated in FIG. 14B, second protrusion 431 is protruded from the top surface (reference surface) of second body 430, and the bottom surface of second recess 432 is at the same height as the top surface (reference surface) of second body 430. Conversely, the top surface of second protrusion 431 may be at the same height as the top surface (reference surface) of second body 430, and in this case, second recess 432 is recessed from the top surface (reference surface) of second body 430.

Operation of Fluid Handling Device

Figure 15:
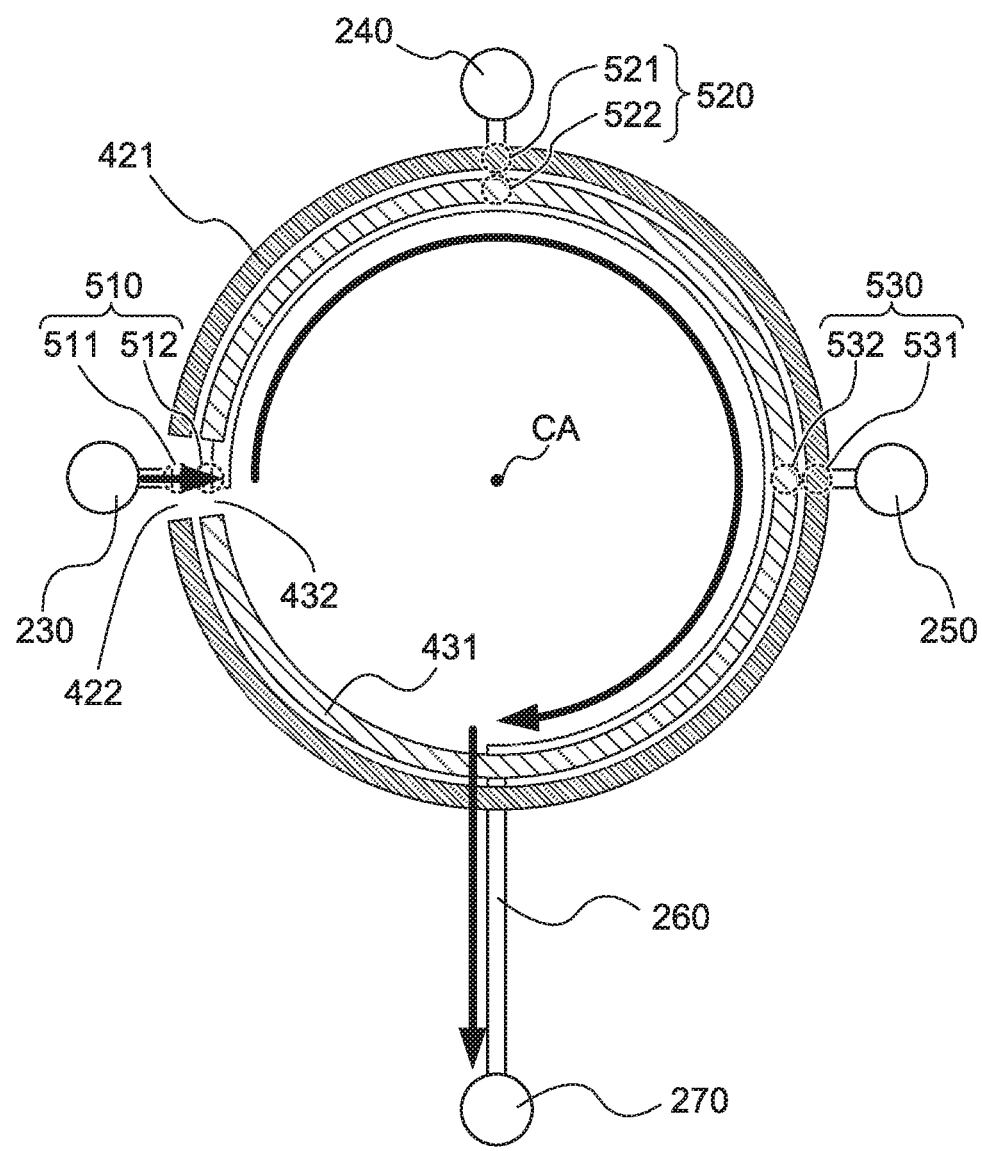
FIG. 15 is a schematic view for describing an operation of a fluid handling device according to Embodiment 3.
Figure 16:
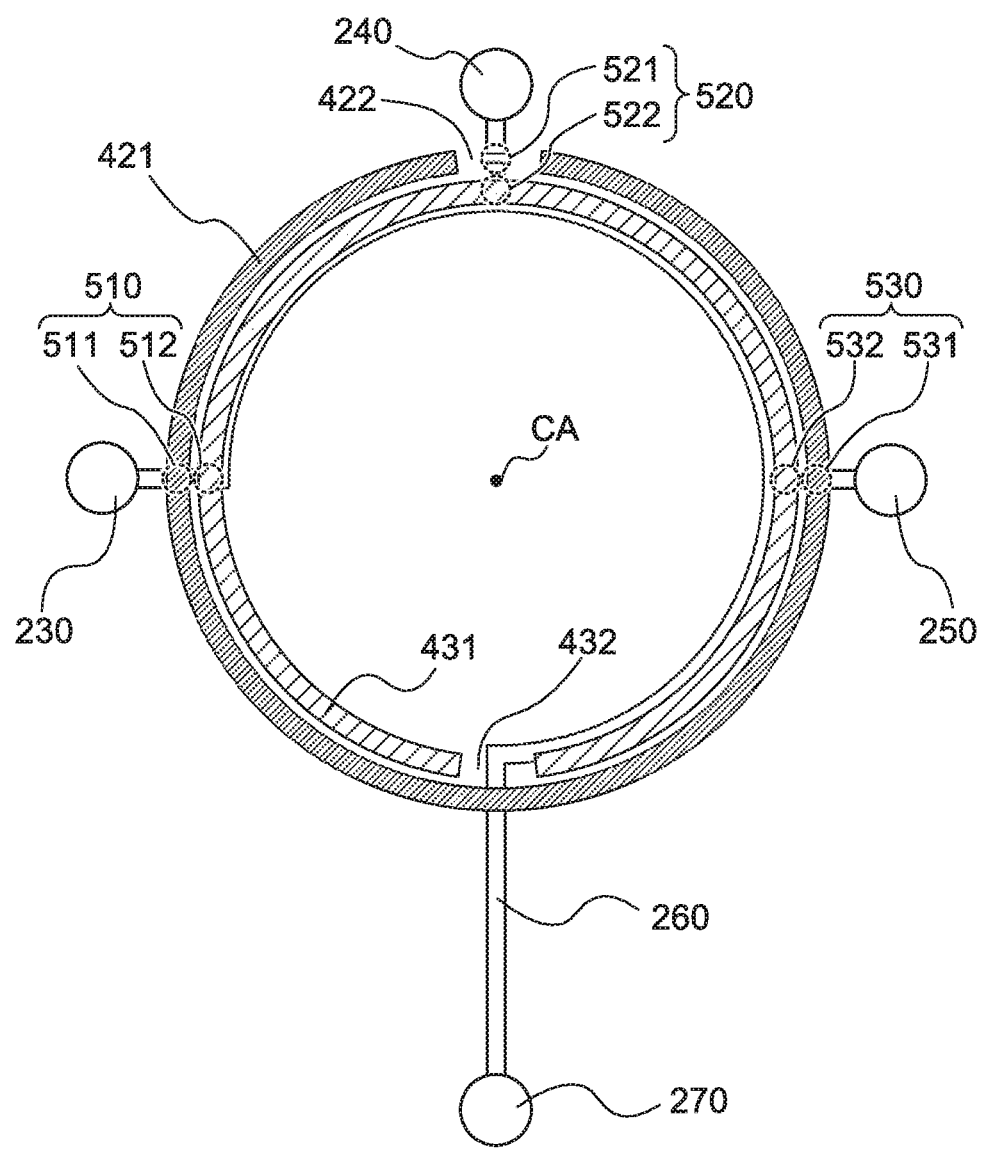
FIG. 16 is a schematic view for describing an operation of the fluid handling device according to Embodiment 3.
Figure 17:
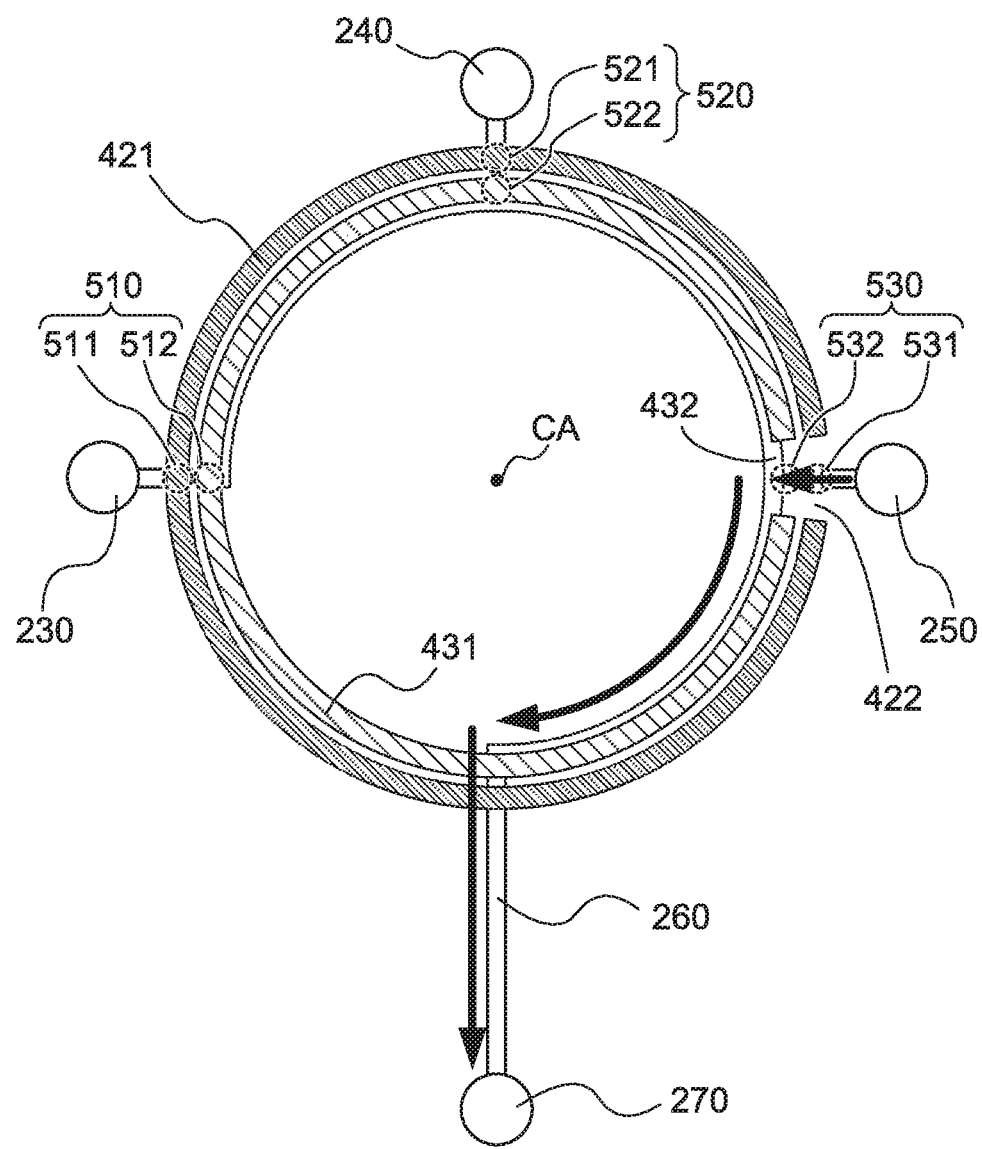
FIG. 17 is a schematic view for describing an operation of the fluid handling device according to Embodiment 3.

Next, with reference to FIGS. 15 to 17, an operation of fluid handling device 400 is described. For convenience of description, in FIGS. 15 to 17, first protrusion 421 and second protrusion 431 are hatched when they are in contact with film 220 of channel chip 500, and are not hatched when they are not in contact with film 220 of channel chip 500. Assume that first liquid is housed in first inlet 230, second liquid is housed in second inlet 240, third liquid is housed in third inlet 250, and that a pressure is exerted on first inlet 230, second inlet 240 and third inlet 250.

First, first body 420 is rotated such that first recess 422 is located over first sub valve 511 of first valve 510, and that first protrusion 421 is located over first sub valve 521 of second valve 520 and first sub valve 531 of third valve 530 to open first sub valve 511 of first valve 510, and close first sub valve 521 of second valve 520 and first sub valve 531 of third valve 530. In addition, second body 430 is rotated such that second recess 432 is located over second sub valve 512 of first valve 510 and that second protrusion 431 is located over second sub valve 522 of second valve 520 and second sub valve 532 of third valve 530 to open second sub valve 512 of first valve 510 and close second sub valve 522 of second valve 520 and second sub valve 532 of third valve 530. In this manner, as illustrated in FIG. 15, the first liquid in first inlet 230 moves to outlet 270 through first introduction channel 231, first valve 510 and common channel 260. At this time, second valve 520 and third valve 530 are closed, and therefore the second liquid in second inlet 240 and the third liquid in third inlet 250 do not flow into common channel 260.

Next, assume that the third liquid in third inlet 250 is to be caused to flow through common channel 260. In this case, first body 420 is required to be rotated until first recess 422 is located over first sub valve 531 of third valve 530, and second body 430 is required to be rotated until second recess 432 is located over second sub valve 532 of third valve 530. At this time, for example, first body 420 and second body 430 are rotated in directions opposite to each other such that the positions of first recess 422 and second recess 432 do not coincide with each other until third valve 530 is reached. For example, as illustrated in FIG. 16, the diaphragm of second valve 520 (second sub valve 522) is pressed by second protrusion 431 even when first recess 422 is located over second valve 520 (first sub valve 521) while first body 420 is being rotated. Accordingly, the second liquid in second inlet 240 does not flow into common channel 260 even when first recess 422 or second recess 432 passes over second valve 520 while rotary member 410 (first body 420 and second body 430) is being rotated.

Then, when first recess 422 is located over first sub valve 531 of third valve 530, and first protrusion 421 is located over first sub valve 511 of first valve 510 and first sub valve 521 of second valve 520, the rotation of first body 420 is stopped. In addition, when second recess 432 is located over second sub valve 532 of third valve 530, and second protrusion 431 is located over second sub valve 512 of first valve 510 and second sub valve 522 of second valve 520, the rotation of second body 430 is stopped. In this manner, only third valve 530 is opened. In this manner, as illustrated in FIG. 17, the third liquid in third inlet 250 moves to outlet 270 through third introduction channel 251, third valve 530 and common channel 260. At this time, first valve 510 and second valve 520 are closed, and therefore the first liquid in first inlet 230 and the second liquid in second inlet 240 do not flow into common channel 260.

Through the above-mentioned procedure, the opening and closing of the plurality of valves can be controlled by rotating rotary member 410 (first body 420 and second body 430) without opening unintended valves while rotary member 410 (first body 420 and second body 430) is being rotated.

Effect

Fluid handling device 400 according to Embodiment 3 has an effect similar to that of fluid handling device 100 according to Embodiment 1.

Embodiment 4

Configuration of Fluid Handling Device and Channel Chip

A fluid handling system (fluid handling device 600 and channel chip 500) according to Embodiment 4 differs from fluid handling device 400 and channel chip 500 according to Embodiment 3 only in configuration of rotary member 610. In view of this, the same components as those of fluid handling device 400 and channel chip 500 according to Embodiment 3 are denoted by the same reference numerals, and the descriptions thereof are omitted.

Fluid handling device 600 according to Embodiment 4 is a fluid handling device configured to control the fluid in the channel of channel chip 500 illustrated in FIG. 13, and includes rotary member 610.

Figure 18A:
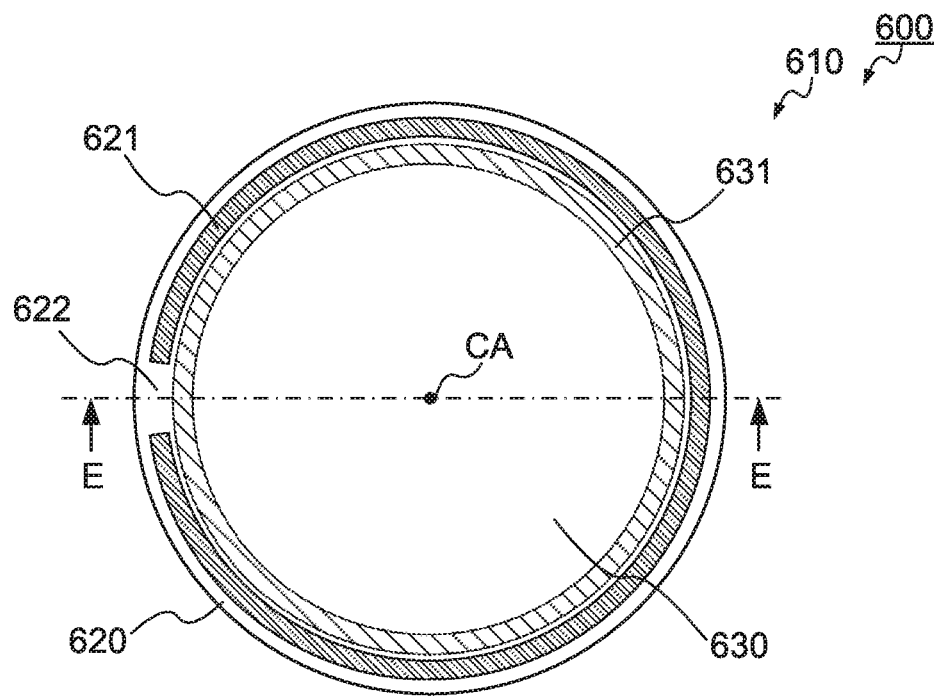
FIG. 18A is a plan view of a rotary member of a fluid handling device according to Embodiment 4.
Figure 18B:
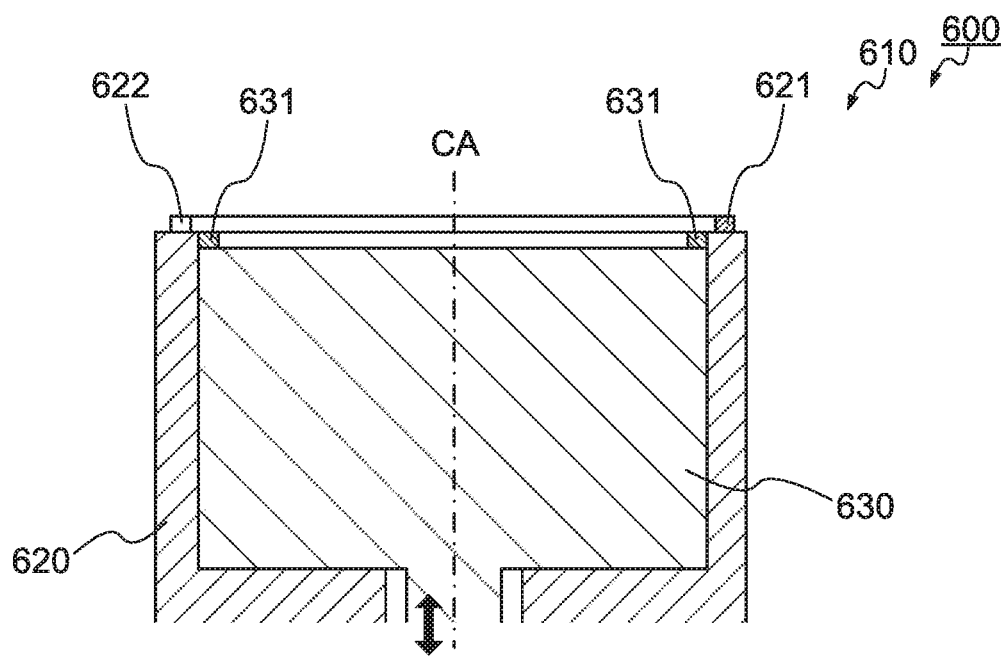
FIG. 18B is a sectional view taken along line E-E of FIG. 18A.

FIG. 18A is a plan view of rotary member 610 of fluid handling device 600 according to Embodiment 4, and FIG. 18B is a sectional view taken along line E-E of FIG. 18A. In FIG. 18A, for the sake of clarity, the top surface of first protrusion 621 and the top surface of second protrusion 631 are hatched.

Rotary member 610 includes cylindrical body 620 and sliding part 630 disposed inside body 620. Body 620 is rotatable around central axis CA. Sliding part 630 is movable in the direction along central axis CA. Sliding part 630 may or may not rotate together with body 620. At least body 620 is rotated by an external driving mechanism not illustrated in the drawing, and sliding part 630 is moved in the direction along central axis CA by the external driving mechanism not illustrated in the drawing.

In the upper part of body 620, first protrusion 621 configured to close first sub valve 511 of first valve 510, first sub valve 521 of second valve 520 or first sub valve 531 of third valve 530 by pressing the diaphragm, and recess 622 configured to open first sub valve 511 of first valve 510, first sub valve 521 of second valve 520 or first sub valve 531 of third valve 530 without pressing the diaphragm are provided. First protrusion 621 and recess 622 are disposed on the circumference of the first circle around central axis CA. In the present embodiment, first protrusion 621 has an arc-like shape corresponding to a portion of the first circle around central axis CA in plan view. The region where first protrusion 621 is not present on the circumference of the first circle is recess 622.

Note that it suffices that first protrusion 621 is relatively protruded than recess 622, and that recess 622 is relatively recessed than first protrusion 621. That is, it suffices that first protrusion 621 can function as a pressing part, and that recess 622 can function as a non-pressing part. For example, in the example illustrated in FIG. 18B, first protrusion 621 is protruded from the top surface (reference surface) of body 620, and the bottom surface of recess 622 is at the same height as the top surface (reference surface) of body 620. Conversely, the top surface of first protrusion 621 may be at the same height as the top surface (reference surface) of body 620, and in this case, recess 622 is recessed from the top surface (reference surface) of body 620.

On the other hand, in the upper part of sliding part 630, second protrusion 631 configured to close second sub valve 512 of first valve 510, second sub valve 522 of second valve 520 and second sub valve 532 of third valve 530 by pressing the diaphragm when rotary member 610 (body 620) is rotated is provided. Second protrusion 631 is disposed on the circumference of the second circle around central axis CA inside or outside the first circle in rotary member 610. In the present embodiment, second protrusion 631 is disposed on the circumference of the second circle around central axis CA inside the first circle. In the present embodiment, second protrusion 631 has a circular shape corresponding to the entire circumference of the second circle in plan view. As described above, sliding part 630 is movable in the direction along central axis CA. Accordingly, second protrusion 631 can be switched between a state that can make contact with the diaphragm of each valve and a state that cannot make contact with the diaphragm of each valve.

Note that second protrusion 631 may not be protruded from the top surface (reference surface) of sliding part 630 as long as second protrusion 631 can be switched between a state that can make contact with the diaphragm of each valve and a state that cannot make contact with the diaphragm of each valve. That is, it suffices that second protrusion 631 can function as a pressing part. While second protrusion 631 is protruded from the top surface (reference surface) of sliding part 630 in the example illustrated in FIG. 18B, the top surface of second protrusion 631 may be at the same height as the top surface (reference surface) of sliding part 630.

Operation of Fluid Handling Device

Figure 19:
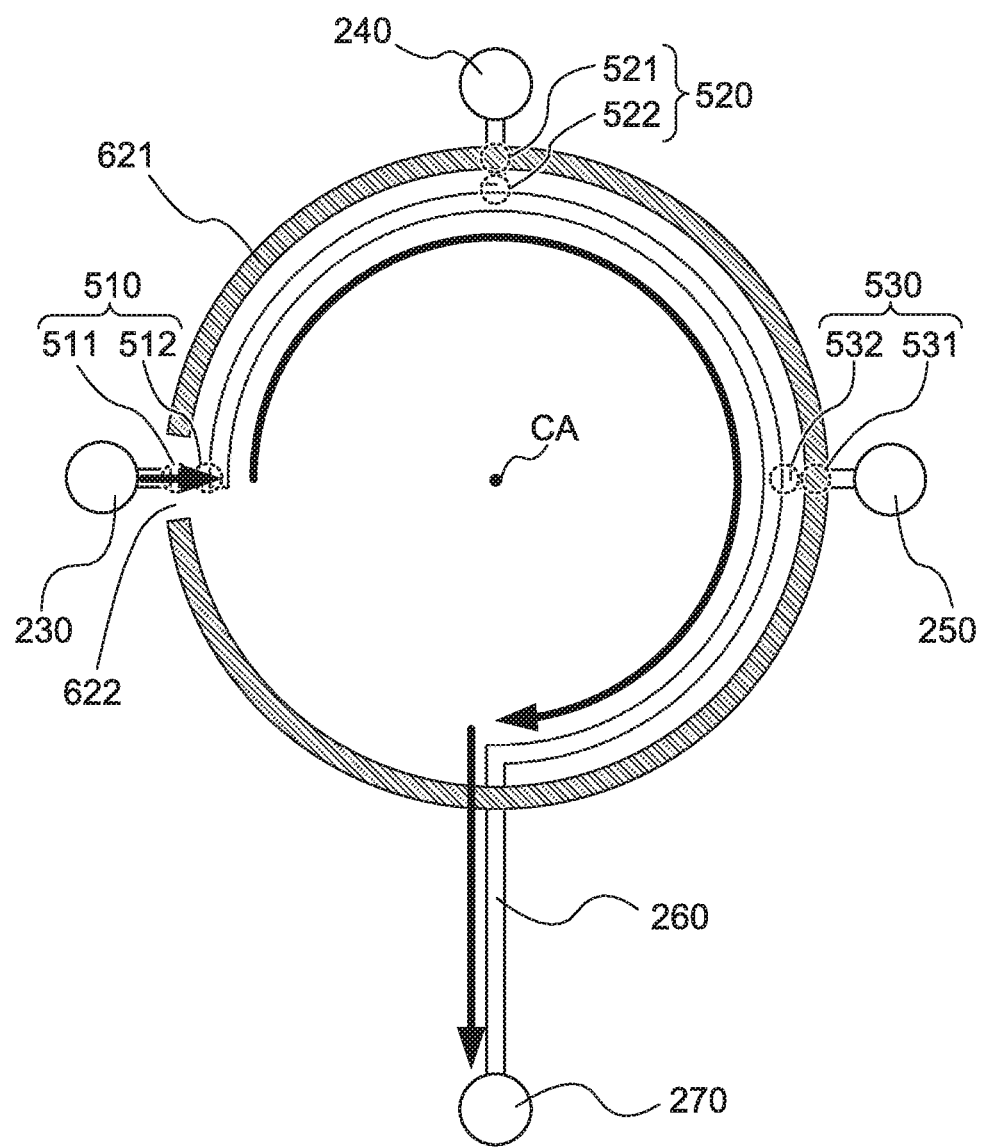
FIG. 19 is a schematic view for describing an operation of the fluid handling device according to Embodiment 4.
Figure 20:
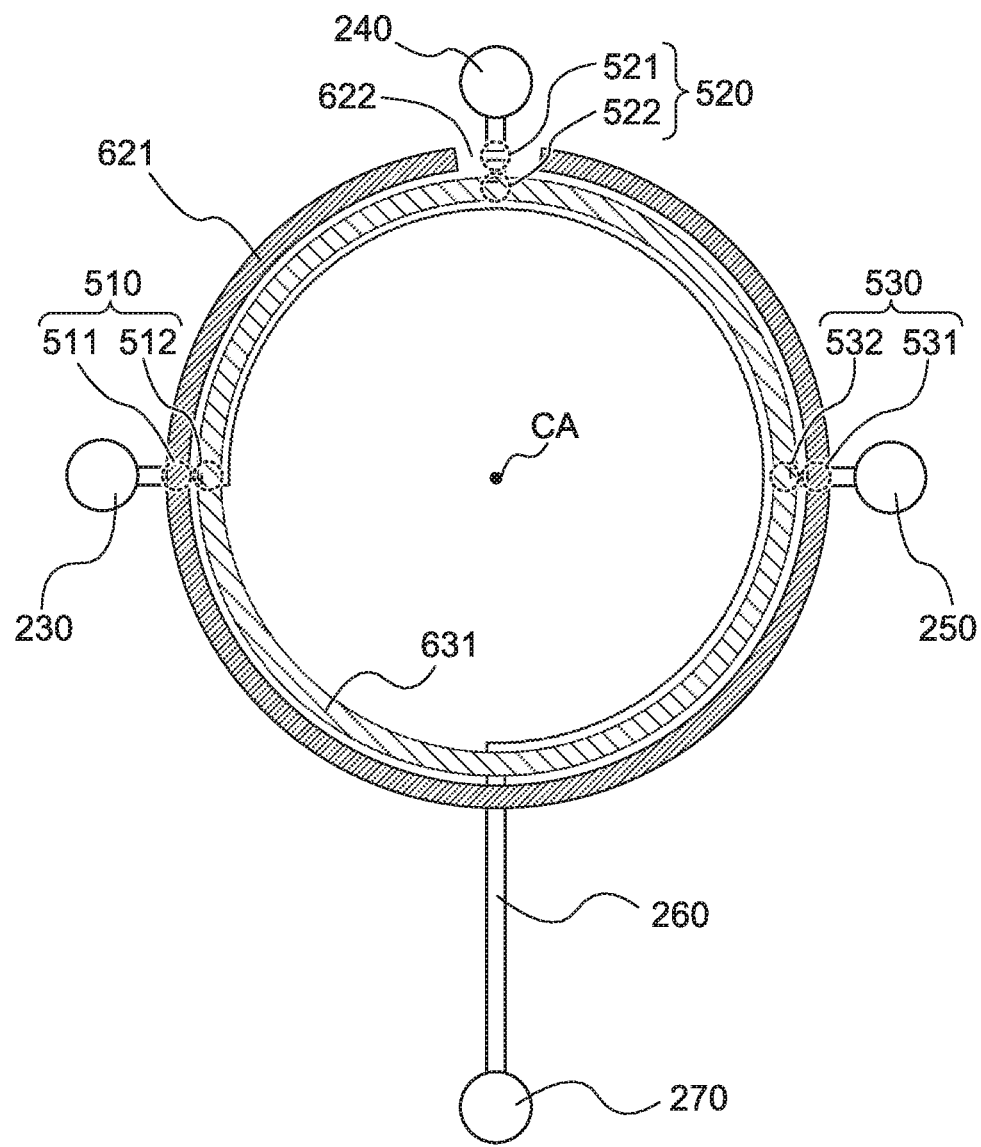
FIG. 20 is a schematic view for describing an operation of the fluid handling device according to Embodiment 4.
Figure 21:
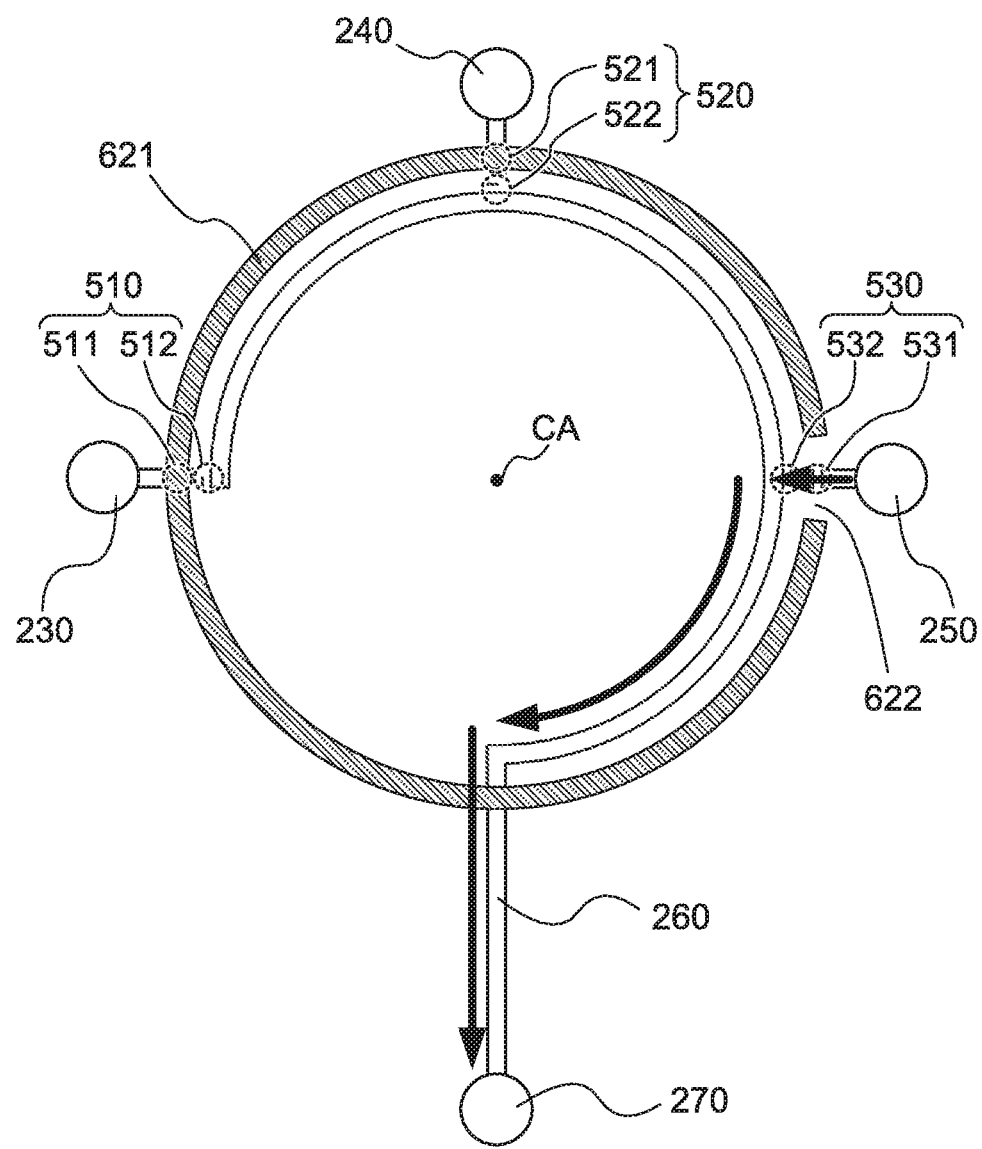
FIG. 21 is a schematic view for describing an operation of the fluid handling device according to Embodiment 4.

Next, with reference to FIGS. 19 to 21, an operation of fluid handling device 600 is described. For convenience of description, in FIGS. 19 to 21, first protrusion 621 and second protrusion 631 are hatched when they are in contact with film 220 of channel chip 500, and are not hatched when they are not in contact with film 220 of channel chip 500. Assume that first liquid is housed in first inlet 230, second liquid is housed in second inlet 240, third liquid is housed in third inlet 250, and that a pressure is exerted on first inlet 230, second inlet 240 and third inlet 250.

First, body 620 is rotated such that recess 622 is located over first sub valve 511 of first valve 510 and that first protrusion 621 is located over first sub valve 521 of second valve 520 and first sub valve 531 of third valve 530 to open first sub valve 511 of first valve 510 and close first sub valve 521 of second valve 520 and first sub valve 531 of third valve 530. In addition, sliding part 630 is moved such that second protrusion 631 does not make contact with film 220 of channel chip 500. In this manner, as illustrated in FIG. 19, the first liquid in first inlet 230 moves to outlet 270 through first introduction channel 231, first valve 510 and common channel 260. At this time, second valve 520 and third valve 530 are closed, and therefore the second liquid in second inlet 240 and the third liquid in third inlet 250 do not flow into common channel 260.

Next, assume that the third liquid in third inlet 250 is to be caused to flow through common channel 260. In this case, rotary member 610 (body 620) is required to be rotated until recess 622 is located over first sub valve 531 of third valve 530. At this time, rotary member 610 (body 620) is rotated after sliding part 630 is moved such that second protrusion 631 makes contact with film 220 of channel chip 500. As illustrated in FIG. 20, the diaphragm of second valve 520 (second sub valve 522) is pressed by second protrusion 631 even when recess 622 is located over second valve 520 (first sub valve 521) while rotary member 610 (body 620) is being rotated. Accordingly, the second liquid in second inlet 240 does not flow into common channel 260 even when recess 622 passes over second valve 520 while rotary member 610 (body 620) is being rotated.

Then, the rotation of rotary member 610 (body 620) is stopped when recess 622 is located over first sub valve 531 of third valve 530 and first protrusion 621 is located over first sub valve 511 of first valve 510 and first sub valve 521 of second valve 520. In addition, sliding part 630 is moved such that second protrusion 631 does not make contact with film 220 of channel chip 500. In this manner, only third valve 530 is opened. In this manner, as illustrated in FIG. 21, the third liquid in third inlet 250 moves to outlet 270 through third introduction channel 251, third valve 530 and common channel 260. At this time, first valve 510 and second valve 520 are closed, and therefore the first liquid in first inlet 230 and the second liquid in second inlet 240 do not flow into common channel 260.

Through the above-mentioned procedure, the opening and closing of the plurality of valves can be controlled by rotating rotary member 610 (body 620) without opening unintended valves while rotary member 610 (body 620) is being rotated.

Effect

Fluid handling device 600 according to Embodiment 4 has an effect similar to that of fluid handling device 100 according to Embodiment 1.

Note that the fluid handling device according to each embodiment may include a friction reduction mechanism for reducing friction between two members. For example, in rotary members 110, 410 and 610 of fluid handling devices 100, 400 and 600 according to Embodiments 1, 3 and 4, a friction reduction mechanism may be provided between body 120, body 620 or first body 420, and sliding part 130, and sliding part 630 or second body 430. In addition, in fluid handling device 300 according to Embodiment 2, a friction reduction mechanism may be provided between body 320 of rotary member 310, and a bottom plate (not illustrated) disposed on the lower side of body 320. Examples of the friction reduction mechanism include lubricant and a bearing.

This application is entitled to and claims the benefit of Japanese Patent Application No. 2018-060326 filed on Mar. 27, 2018, the disclosure each of which including the specification, drawings and abstract is incorporated herein by reference in its entirety.

INDUSTRIAL APPLICABILITY

The fluid handling device of the embodiment of the present invention is suitable for various uses such as laboratory tests, food tests, and environment tests, for example.

REFERENCE SIGNS LIST

10 First inlet
11 First introduction channel
12 First valve
20 Second inlet
21 Second introduction channel
22 Second valve
30 Third inlet
31 Third introduction channel
32 Third valve
40 Common channel
41 Outlet
50 Protrusion of rotary member
51 Recess of rotary member
100, 300, 400, 600 Fluid handling device
110, 310, 410, 610 Rotary member
120, 320, 620 Body
121, 321, 621 First protrusion
122, 322, 622 Recess
130, 330, 630 Sliding part
131, 331, 631 Second protrusion
200, 500 Channel chip
210 Substrate
220 Film
230 First inlet
231 First introduction channel
232 First valve
233 First partition wall
234 First diaphragm
240 Second inlet
241 Second introduction channel
242 Second valve
243 Second partition wall
244 Second diaphragm
250 Third inlet
251 Third introduction channel
252 Third valve
253 Third partition wall
254 Third diaphragm
260 Common channel
270 Outlet
420 First body
421 First protrusion
422 First recess
430 Second body
431 Second protrusion
432 Second recess
510 First valve
511 First sub valve of first valve
512 Second sub valve of first valve
520 Second valve
521 First sub valve of second valve
522 Second sub valve of second valve
530 Third valve
531 First sub valve of third valve
532 Second sub valve of third valve
CA Central axis

What is claimed is:

1. A fluid handling system, comprising:
    a channel chip; and
    a fluid handling device configured to control fluid in a channel of the channel chip,
    wherein the channel chip includes:
        a plurality of introduction channels;
        a common channel connected to the plurality of introduction channels; and
        a plurality of valves disposed for the plurality of introduction channels, each of the plurality of valves being disposed in each of the plurality of introduction channels or at a connecting portion between each of the introduction channel and the common channel, and
    wherein the fluid handling device includes a rotary member rotatable around a central axis, the rotary member including:
        a first protrusion configured to close the plurality of valves by pressing a diaphragm of each of the plurality of valves;
        a recess configured to open the plurality of valves without pressing the diaphragm of each of the plurality of valves, the first protrusion and the recess being disposed on a circumference of a first circle around the central axis; and
        a second protrusion configured to close a valve of the plurality of valves that is opposite to the recess by pressing a diaphragm of the valve of the plurality of valves when the recess is located over the valve of the plurality of valves in a state where the rotary member is rotated.

2. The fluid handling system according to claim 1, wherein the second protrusion is disposed on a circumference of a second circle disposed around the central axis, the second circle being disposed inside or outside the first circle.

3. The fluid handling system according to claim 2,
    wherein the first protrusion has an arc-like shape corresponding to a portion of the circumference of the first circle in plan view;

wherein the second protrusion has a circular shape corresponding to an entirety of the circumference of the second circle in plan view; and wherein the second protrusion is switchable between a state capable of making contact with the diaphragm of each of the plurality of valves and a state incapable of making contact with the diaphragm of each of the plurality of valves.

4. The fluid handling system according to claim 2, wherein the first protrusion has an arc-like shape corresponding to a portion of the circumference of the first circle in plan view;

wherein the second protrusion has an arc-like shape corresponding to a portion of the circumference of the second circle in plan view; and wherein the first protrusion and the second protrusion are rotatable independently from each other.

5. The fluid handling system according to claim 2, wherein each of the plurality of valves includes a first sub valve and a second sub valve, the first sub valve and the second sub valve being disposed next to each other in each of the plurality of introduction channels;

wherein the first protrusion presses a diaphragm of the first sub valve of each of the plurality of introduction channels; and wherein the second protrusion presses a diaphragm of the second sub valve of each of the plurality of introduction channels.

6. The fluid handling system according to claim 1, wherein the second protrusion is disposed at a same position as the recess on the circumference of the first circle; and wherein the second protrusion is switchable between a state capable of making contact with the diaphragm of each of the plurality of valves and a state incapable of making contact with the diaphragm of each of the plurality of valves.

* * * * *